United States Patent
Kim et al.

(10) Patent No.: US 11,588,453 B2
(45) Date of Patent: Feb. 21, 2023

(54) SIGNAL RECEIVER AND OPERATION METHOD THEREOF

(71) Applicant: Samsung Electronics Co., Ltd., Suwon-si (KR)

(72) Inventors: Kyoungho Kim, Hwaseong-si (KR); Chulwoo Kim, Seoul (KR); Hyunsu Park, Seoul (KR); Jin-Cheol Sim, Seoul (KR)

(73) Assignees: SAMSUNG ELECTRONICS CO., LTD.; Korea University Research and Business Foundation

( * ) Notice: Subject to any disclaimer, the term of this patent is extended or adjusted under 35 U.S.C. 154(b) by 187 days.

(21) Appl. No.: 17/176,239

(22) Filed: Feb. 16, 2021

(65) Prior Publication Data

US 2021/0313937 A1    Oct. 7, 2021

(30) Foreign Application Priority Data

Apr. 3, 2020   (KR) .................. 10-2020-0041137

(51) Int. Cl.
*H03F 3/45*   (2006.01)
*H03F 3/217*  (2006.01)
(Continued)

(52) U.S. Cl.
CPC ......... *H03F 3/2178* (2013.01); *H03F 1/3211* (2013.01); *H03F 3/45475* (2013.01); *H04L 25/0272* (2013.01)

(58) Field of Classification Search
CPC ....................................................... H03F 3/45
(Continued)

(56) References Cited

U.S. PATENT DOCUMENTS 3,908,778 A    9/1975  Sien et al.
8,081,019 B2 * 12/2011  Jungreis ............... H02M 1/15
                                                         327/119
(Continued)

FOREIGN PATENT DOCUMENTS

JP    6227733 B1      11/2017
JP    2019-016832 A    1/2019
KR    10-2009-0001356 A  1/2009

OTHER PUBLICATIONS

L. Tang et al., "A 32Gb/s 133mW PAM-4 Transceiver with DFE Based on Adaptive Clock Phase and Threshold Voltage in 65nm CMOS", 2018 ISSCC, pp. 114-116.
(Continued)

*Primary Examiner* — Henry Choe
(74) *Attorney, Agent, or Firm* — Fish & Richardson P.C.

(57) ABSTRACT

A signal receiver includes a data sampler receiving a differential input signal having first and second input signals and determining bit values of the differential input signal based on first and second reference voltages, and a reference voltage generator performing a pre-tuning operation and a post-tuning operation to generate the reference voltages. The reference voltage generator performs the pre-tuning operation by generating first and second initial voltages and adjusting one of the initial voltages to generate third and fourth voltages. After the pre-tuning operation, the reference voltage generator performs the post-tuning operation by increasing or decreasing the third voltage to generate the first reference voltage and decreasing or increasing the fourth voltage to generate the second reference voltage based on a comparison result between the third voltage and the first input signal and a second comparison result between the fourth voltage and second input signal.

20 Claims, 15 Drawing Sheets

(51) Int. Cl.
 *H03F 1/32* (2006.01)
 *H04L 25/02* (2006.01)

(58) Field of Classification Search
 USPC .................................................. 330/252, 69
 See application file for complete search history.

(56) References Cited

U.S. PATENT DOCUMENTS

| | | | |
|---|---|---|---|
| 9,264,270 B2 | 2/2016 | Lusted et al. | |
| 10,181,969 B2* | 1/2019 | Li | H04B 1/16 |
| 10,225,111 B2 | 3/2019 | Stojanovic et al. | |
| 10,331,193 B2* | 6/2019 | Ware | G06F 1/3237 |
| 10,484,229 B2 | 11/2019 | Tokuhiro | |
| 2004/0141567 A1* | 7/2004 | Yang | H04L 25/069 |
| | | | 375/353 |
| 2010/0127737 A1* | 5/2010 | Jungreis | H02M 1/12 |
| | | | 327/122 |
| 2018/0167240 A1* | 6/2018 | Li | H04L 25/03057 |

OTHER PUBLICATIONS

Peng et al., A 56Gbs PAM-4NRZ Transceiver in 40nm CMOS, ISSCC 2017.

* cited by examiner

SIGNAL RECEIVER AND OPERATION METHOD THEREOF

CROSS-REFERENCE TO RELATED APPLICATIONS

This application claims priority under 35 U.S.C. § 119 to Korean Patent Application No. 10-2020-0041137 filed on Apr. 3, 2020, in the Korean Intellectual Property Office, the disclosures of which are incorporated by reference herein in their entireties.

BACKGROUND

Embodiments of the inventive concept disclosed herein relate to an electronic device, and more particularly, relate to a signal receiver and an operation method thereof.

An electronic device includes various function blocks or devices configured to provide various functions. To provide various functions, various function blocks or devices may exchange data. In general, data transmission between those function blocks or devices is performed by using a modulation scheme to transmit one bit during one unit interval (UI) like a non-return to zero (NRZ) scheme.

As performance of an electronic device is improved, a high communication speed may be desirable between function blocks or devices. To this end, a modulation scheme (e.g., PAM-4) may be used to transmit a plurality of bits (e.g., two bits) during one unit interval. In the PAM-4 scheme, a signal receiver determines bit values of an input signal received by using a plurality of reference voltages (e.g., three reference voltages) determined in advance. However, in the case where distortion occurs in an input signal, bit values are not properly determined through the reference voltages.

SUMMARY

Embodiments of the inventive concept provide a signal receiver having improved reliability and an operation method thereof.

According to an exemplary embodiment of the present invention, a signal receiver includes a data sampler configured to receive a differential input signal having a first input signal and a second input signal being a complementary signal of the first input signal and to determine bit values of the differential input signal based on a first reference voltage and a second reference voltage, and a reference voltage generator configured to perform a pre-tuning operation and a post-tuning operation to generate the first reference voltage and the second reference voltage. The reference voltage generator performs the pre-tuning operation by generating a first initial voltage and a second initial voltage and adjusting one of the first initial voltage and the second initial voltage to generate a third voltage and a fourth voltage, based on the first input signal and the second input signal. After the pre-tuning operation is performed, the reference voltage generator performs the post-tuning operation by increasing or decreasing the third voltage to generate the first reference voltage and decreasing or increasing the fourth voltage to generate the second reference voltage based on a first comparison result between the third voltage and the first input signal and a second comparison result between the fourth voltage and second input signal.

According to an exemplary embodiment of the present invention, an operation method of a signal receiver includes receiving a differential input signal having a first input signal and a second input signal being a complementary signal of the first input signal, performing a pre-tuning operation including generating a first peak voltage, a second peak voltage, and a common voltage based on the first input signal and the second input signal, wherein the first peak voltage is greater than the second peak voltage, and wherein the common voltage is between the first peak voltage and the second peak voltage, setting a first initial voltage and a second initial voltage, wherein the first initial voltage and the second initial voltage are between the first peak voltage and the second peak voltage, and increasing or decreasing one of the first initial voltage and the second initial voltage to generate a first voltage and a second voltage until the first voltage and the second voltage satisfy a first condition, performing, after the performing of the pre-tuning operation, a post-tuning operation to generate a first optimal reference voltage and a second optimal reference voltage, the post-tuning operation including increasing or decreasing the first voltage stepwise and decreasing or increasing the second voltage stepwise to generate a first optimal reference voltage and a second optimal reference voltage until the first optimal reference voltage and the second optimal reference voltage satisfy a second condition, wherein the first voltage increased or decreased and the second voltage decreased or increased, during a time when the post-tuning operation is performed, satisfy the first condition, and determining bit values of the differential input signal based on the first optimal reference voltage and the second optimal reference voltage.

According to an exemplary embodiment of the present invention, an operation method of a signal receiver includes performing an initialization operation to generate a first reference voltage and a second reference voltage, receiving a differential input signal having a first input signal and a second input signal being a complementary signal of the first input signal from an external device, determining first bit values of the differential input signal based on the first and second reference voltages, wherein the differential input signal is an N-level PAM (PAM-N) multilevel signal, N being greater than four inclusive, detecting whether distortion occurs on the differential input signal based on the determined first bit values thereof, performing, in response to the detecting of the distortion, a pre-tuning operation by adjusting one of the first reference voltage and the second reference voltage to generate a first voltage and a second voltage based on the first input signal and the second input signal, performing a post-tuning operation by increasing or decreasing the first voltage to generate a first optimal reference voltage and decreasing or increasing the second voltage to generate a second optimal reference voltage based on a first comparison result between the first voltage and the first input signal and a second comparison result between the second voltage and the second input signal, and determining second bit values of the differential input signal based on the first optimal reference voltage and the second optimal reference voltage.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Below, embodiments of the inventive concept may be described in detail and clearly to such an extent that an ordinary one in the art easily implements the inventive concept.

Below, components described in the specification by using terms "part", "unit", etc., and function blocks illustrated in drawings may be implemented with software, hardware, or a combination thereof. For example, the software may be a machine code, firmware, an embedded code, or application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Also, unless differently defined, all terms used herein, which include technical terminologies or scientific terminologies, have the same meaning as that understood by a person skilled in the art to which the inventive concept belongs. Terms defined in a generally used dictionary are to be interpreted to have meanings equal to the contextual meanings in a relevant technical field, and are not interpreted to have ideal or excessively formal meanings unless clearly defined in the specification.

Figure 1:
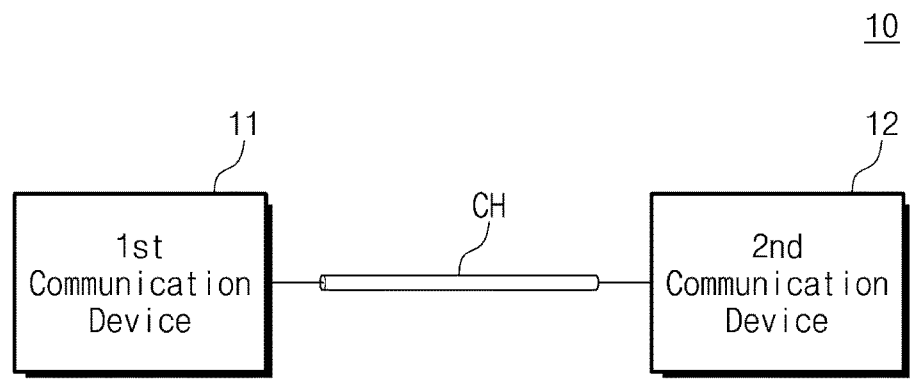
FIG. 1 is a block diagram illustrating an electronic device according to an embodiment of the inventive concept.
Figure 2A:
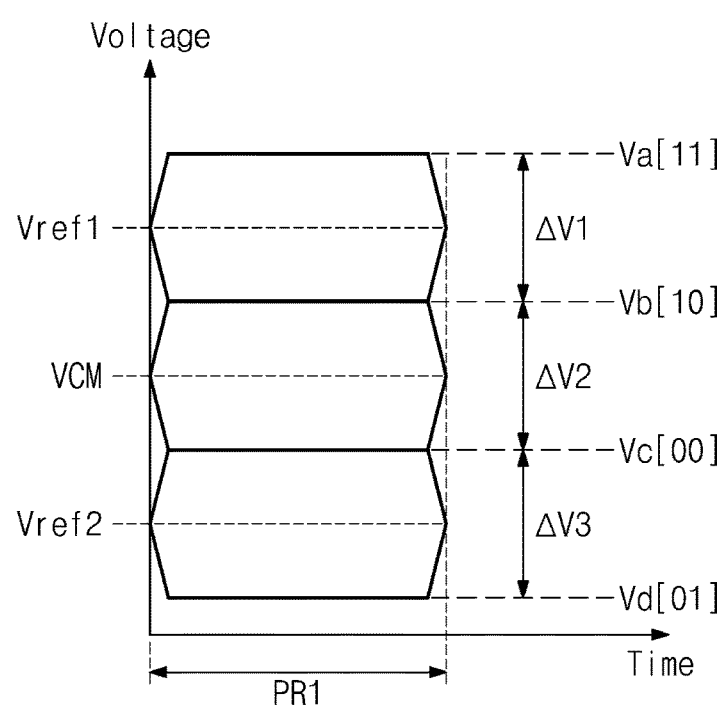
FIGS. 2A and 2B are graphs illustrating data eyes for describing 4-level pulse amplitude modulation.
Figure 2B:
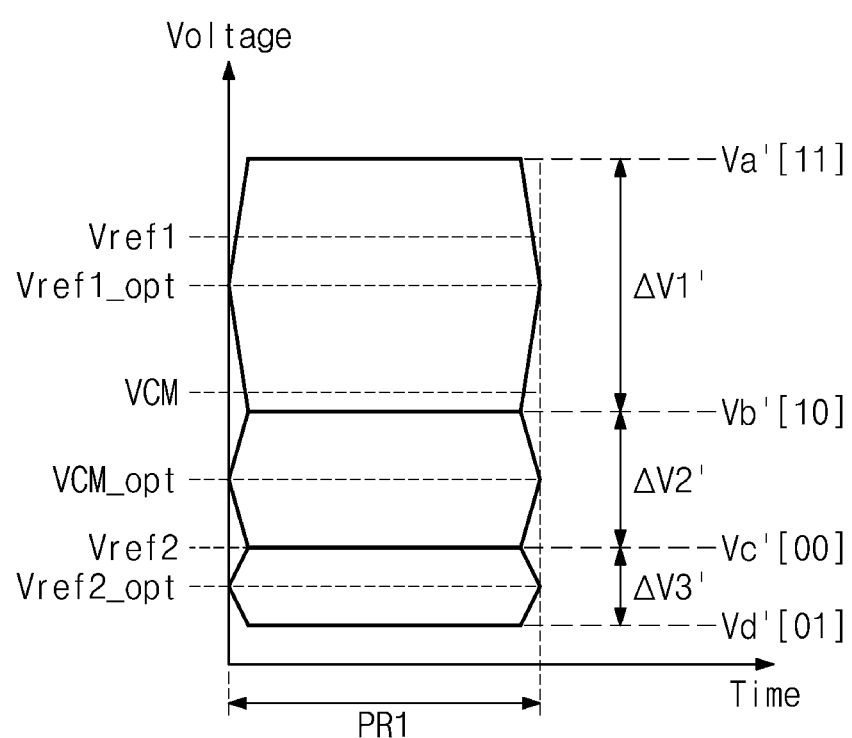

FIG. 1 is a block diagram illustrating an electronic device according to an embodiment of the inventive concept. FIGS. 2A and 2B are graphs illustrating data eyes for describing 4-level pulse amplitude modulation. In the graphs of FIGS. 2A and 2B, a horizontal axis represents a time, and a vertical axis represents a voltage level. Below, to describe the technical idea of the inventive concept, it is assumed that a signal or an input signal transmitted/received through a channel CH is a signal modulated based on the 4-level pulse amplitude modulation (PAM-4). However, the inventive concept is not limited thereto. For example, a signal or an input signal transmitted/received through the channel CH may be a signal modulated based on an N-level pulse amplitude modulation (PAM-N) scheme (N being an integer more than 2) or various other signal modulation schemes.

Referring to FIG. 1, an electronic device 10 may include a first communication device 11 and a second communication device 12. The first communication device 11 and the second communication device 12 may perform communication through the channel CH. In an exemplary embodiment, each of the first communication device 11 and the second communication device 12 may be implemented in the form of a portable communication terminal, a personal digital assistant (PDA), a portable multimedia player (PMP), a smartphone, or a wearable device or in the form of a computing device such as a personal computer, a server, a workstation, or a notebook computer. Alternatively, each of the first communication device 11 and the second communication device 12 may be one of various function blocks (e.g., intellectual property (IP) blocks) included in the same semiconductor chip.

The channel CH may be a signal line (i.e., a wired communication channel) that electrically connect the first communication device 11 and the second communication device 12. The present invention is not limited thereto. In an example embodiment, the channel CH may be a wireless communication channel. Each of the first communication device 11 and the second communication device 12 may transmit/receive various types of signals such as an electrical signal, an optical signal, and a wireless signal. Below, for convenience of description, it is assumed that the first communication device 11 and the second communication device 12 operate based on an electrical signal.

In an exemplary embodiment, the first communication device 11 and the second communication device 12 may exchange data based on the 4-level pulse amplitude modulation (PAM-4). The 4-level pulse amplitude modulation may indicate a modulation scheme to transmit two data bits during one data transmission period (e.g., a first period PR1 of FIGS. 2A and 2B).

For example, the first communication device 11 may transmit two bits (e.g., one of four different bit values 11, 10, 01, and 11) to the second communication device 12 during the one data transmission period. Hereinafter, the bit values may be referred to using a bracket. For example, as illustrated in FIG. 2A, data bits of [11] may correspond to a first voltage Va, data bits of [10] may correspond to a second voltage Vb, data bits of [00] may correspond to a third voltage Vc, and data bits of [01] may correspond to a fourth voltage Vd.

The first communication device 11 may transmit an input signal, which is based on a signal level corresponding to a combination of two bits, to the second communication device 12. The second communication device 12 may receive the input signal from the first communication device 11 and may determine two data bits received from the first communication device 11 based on a result of comparing reference voltages and a voltage of the received input signal.

For example, as illustrated in FIG. 2A, in the case where the first communication device 11 transmits an input signal based on the first voltage Va corresponding to the data bits of [11] to the second communication device 12, the second communication device 12 may determine that a voltage of the received input signal is higher than a first reference voltage Vref1, that is, may determine the received input signal corresponds to data bits of [11]. Likewise, the second communication device 12 may determine data bits corresponding to the received input signal based on results of comparing the received input signal with the first reference voltage Vref1, a common voltage VCM, and a second reference voltage Vref2.

As illustrated in FIG. 2A, in the ideal 4-level pulse amplitude modulation PAM-4, differences (e.g., ΔV1, ΔV2, and ΔV3) between the first to fourth voltages Va to Vd may be equal, and reference voltages that are used to determine bit values of an input signal may be set to the first reference voltage Vref1, the common voltage VCM, and the second reference voltage Vref2. In this case, the first reference voltage Vref1 may be an intermediate level of the first and second voltages Va and Vb, the common voltage VCM may be an intermediate level of the second and third voltages Vb and Vc, and the second reference voltage Vref2 may be an intermediate level of the third and fourth voltages Vc and Vd.

In an exemplary embodiment, as an input signal transmitted from the first communication device 11 passes through the channel CH, distortion may occur to the input signal. In this case, the second communication device 12 may fail to accurately determine bit values corresponding to the input signal received from the first communication device 11.

For example, as illustrated in FIG. 2B, in 4-level pulse amplitude modulation PAM-4' where distortion occurs, differences (e.g., ΔV1', ΔV2', and ΔV3') between the first to fourth voltages Va' to Vd' may be different. Under this condition, in the case where the second communication device 12 uses the first reference voltage Vref1, the common voltage VCM, and the second reference voltage Vref2, the second communication device 12 may fail to properly determine bit values corresponding to the input signal transmitted from the first communication device 11. For example, in the case where the first communication device 11 transmits an input signal corresponding to data bits of [10], in the 4-level pulse amplitude modulation PAM-4' where the distortion occurs, the second communication device 12 may receive the input signal corresponding to the second voltage Vb'. Because the second voltage Vb' is smaller than the common voltage VCM and is greater than the second reference voltage Vref2, the second communication device 12 may inaccurately determine bit values corresponding to the received input signal as [00] instead of [10]. To avoid such inaccurate determination of the second communication device 12 due to the channel CH or various other factors, the 4-level pulse amplitude modulation PAM-4' of the second communication device 12 may generate or track optimal reference voltages (e.g., Vref1_opt, VCM_opt, and Vref2_opt) and determine bit values of the received input signal using the optimal reference voltages.

In an exemplary embodiment, the distortion of the input signal illustrated in FIG. 2B is illustrated as downward distortion where all voltage levels corresponding to bit values decrease, but the inventive concept is not limited thereto. For example, the distortion of the input signal may include upward distortion where all voltage levels corresponding to bit values increase or various types of distortions where differences between voltage levels corresponding to bit values are different.

A communication device or a signal receiver according to an embodiment of the inventive concept may generate or track optimal reference voltages based on an input signal. A configuration and an operation method of a signal receiver according to an embodiment of the inventive concept will be more fully described below.

Figure 3:
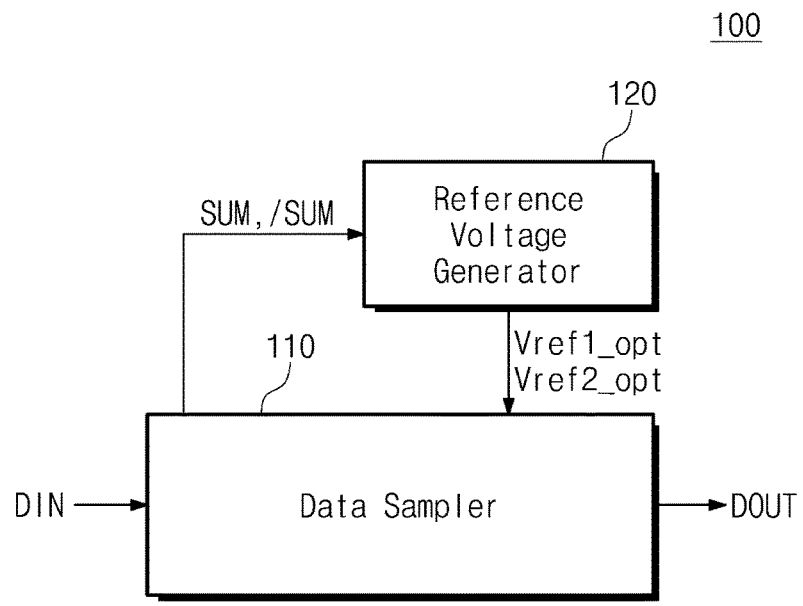
FIG. 3 is a block diagram illustrating a signal receiver according to an embodiment of the inventive concept.

FIG. 3 is a block diagram illustrating a signal receiver according to an embodiment of the inventive concept. In an exemplary embodiment, a signal receiver 100 of FIG. 3 may be included in the first communication device 11 or the second communication device 12 of FIG. 1 and may be configured to receive an input signal through the channel CH.

Referring to FIGS. 1 and 3, the signal receiver 100 may include a data sampler 110 and a reference voltage generator 120. The data sampler 110 may receive an input signal DIN through the channel CH. In an exemplary embodiment, the input signal DIN may be a signal modulated through the 4-level pulse amplitude modulation PAM-4. The input signal DIN may be a differential signal which may be implemented using a differential pair of two complementary signals. The data sampler 110 may determine bit values corresponding to the received input signal DIN, based on first and second reference voltages Vref1_opt and Vref2_opt. A configuration of the data sampler 110 will be more fully described with reference to FIG. 4.

In an exemplary embodiment, the first and second reference voltages Vref1_opt and Vref2_opt may be reference voltages Vref1_opt and Vref2_opt that are optimized with respect to the received input signal DIN. For example, the reference voltage generator 120 may receive pre-processed signals SUM and /SUM from the data sampler 110. The pre-processed signal /SUM corresponds to a complementary signal of the pre-processed signal SUM. In an exemplary embodiment, the pre-processed signals SUM and /SUM may be a signal that is pre-processed by the data sampler 110 based on the input signal DIN. That is, the pre-processed signals SUM and /SUM may be a signal corresponding to the input signal DIN. The reference voltage generator 120 may generate the first and second reference voltages Vref1_opt and Vref2_opt based on the pre-processed signals SUM and /SUM. A configuration and an operation of the reference voltage generator 120 will be more fully described with reference to drawings below.

As described above, the signal receiver 100 according to an embodiment of the inventive concept may generate the optimal reference voltages Vref1_opt and Vref2_opt based on the input signal DIN. As such, even though various distortions occur at the channel CH, the signal receiver 100 may accurately determine bit values corresponding to an input signal by using the optimal reference voltages Vref1_opt and Vref2_opt.

Figure 4:
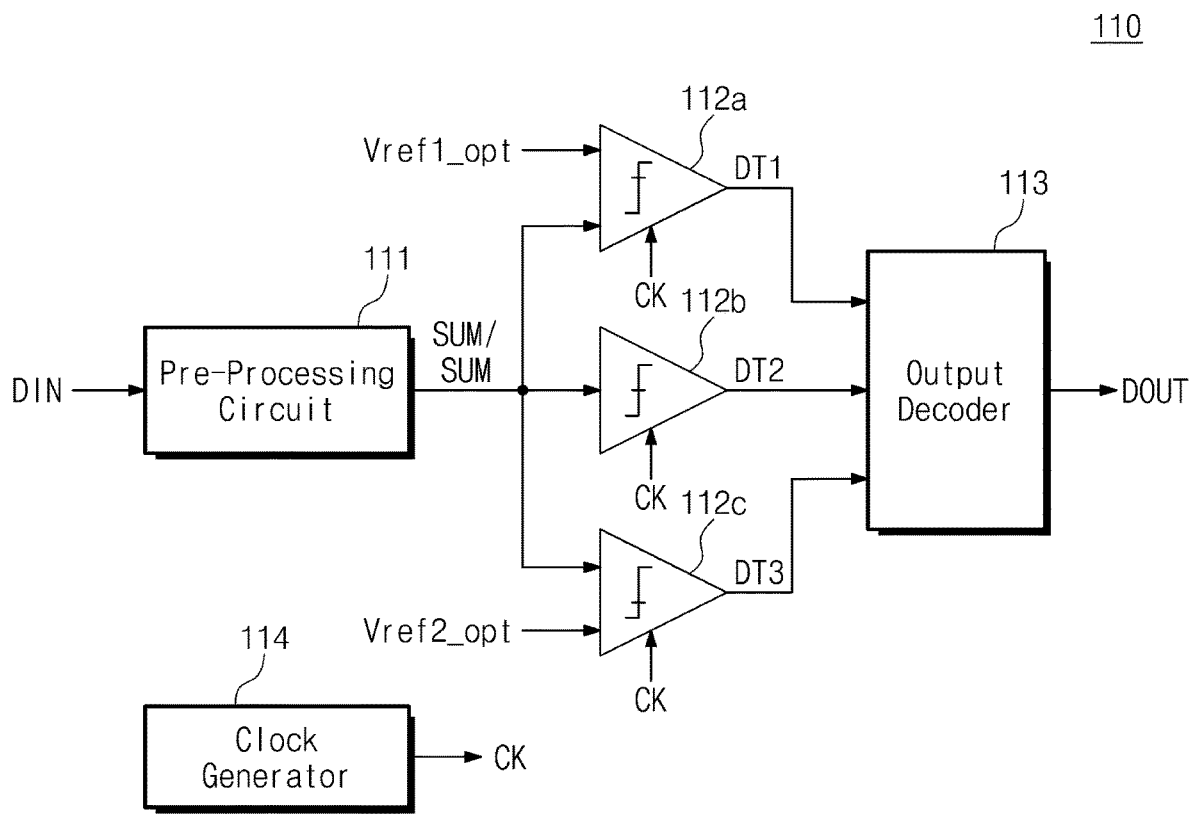
FIG. 4 is a block diagram illustrating a data sampler of FIG. 3.

FIG. 4 is a block diagram illustrating a data sampler of FIG. 3. For brevity of illustration and for convenience of description, components that are unnecessary to describe a configuration of the data sampler 110 are omitted. In FIG. 4, signal lines are illustrated by one solid line, but the inventive concept is not limited thereto. For example, one signal may indicate two complementary signals of a differential signal.

Below, for convenience of description, a reference sign "_opt" is used. The reference sign "_opt" may indicate components optimized according to an embodiment of the inventive concept. For example, both "Vref1" and "Vref1_opt" may be used to indicate a first reference voltage. In this case, "Vref1" may indicate a first reference voltage that is recognized in an optimization process, and "Vref1_opt" may indicate a first reference voltage that is in a state where optimization is completed, that is, is optimized. However, the inventive concept is not limited thereto. For example, the meaning of each of reference numerals and terms should be understood based on the context of embodiments of the inventive concept.

Referring to FIGS. 1, 3, and 4, the data sampler 110 may include a pre-processing circuit 111, first to third comparators 112a, 112b, and 112c, an output decoder 113, and a clock generator 114.

The pre-processing circuit 111 may receive the input signal DIN through the channel CH. The pre-processing circuit 111 may perform pre-processing on the received input signal DIN to output the pre-processed signals SUM and /SUM. For example, the pre-processing circuit 111 may include analog signal processing circuits such as a continuous time linear equalizer (CTLE) and a pre-amplifier. The input signal DIN may be pre-processed by the pre-processing circuit 111 including the analog signal processing circuits described above. In an exemplary embodiment, the pre-processed signals SUM and /SUM may be differential signals.

Each of the first to third comparators 112a, 112b, and 112c may compare the pre-processed signals SUM and /SUM with the corresponding one of the first reference voltage Vref1_opt and the second reference voltage Vref2_opt and may output a comparison result. For example, the first comparator 112a may compare the pre-processed signals SUM and /SUM and the first reference voltage Vref1_opt. The first comparator 112a may output a first comparison result DT1 as a comparison result. The second comparator 112b may compare the pre-processed signals SUM and /SUM. The second comparator 112b may output a second comparison result DT2 as a comparison result. The third comparator 112c may compare the pre-processed signals SUM and /SUM and the second reference voltage Vref2_opt. The third comparator 112c may output a third comparison result DT3 as a comparison result.

The output decoder 113 may generate output data DOUT based on the first to third comparison results DT1, DT2, and DT3 from the first to third comparators 112a, 112b, and 112c. For example, in the case of the 4-level pulse amplitude modulation PAM-4 described with reference to FIG. 2A, when all the first to third comparison results DT1, DT2, and DT3 are logical high (i.e., in the case where Vref1_opt>SUM, SUM>/SUM, and Vref2_opt>SUM), the output data DOUT may be [11]. When the first comparison result DT1 is logical low and the second and third comparison results DT2 and DT3 are logical high (i.e., in the case where Vref1_opt<SUM, SUM>/SUM, and Vref2_opt>SUM), the output data DOUT may be [10]. When the first and second comparison results DT1 and DT2 are logical low and the third comparison result DT3 is logical high (i.e., in the case where Vref1_opt<SUM, SUM</SUM, and Vref2_opt>SUM), the output data DOUT may be [00]. When the first to third comparison results DT1 to DT3 are logical low (i.e., in the case where Vref1_opt<SUM, SUM</SUM, and Vref2_opt<SUM), the output data DOUT may be [01]. The output decoder 113 may decide the output data DOUT based on the above scheme and may output the output data DOUT thus decided.

In an exemplary embodiment, as described with reference to FIG. 2A, with three reference voltages, two bit values (i.e., one of four input signal states) in the 4-level pulse amplitude modulation PAM-4 may be identified. In contrast, because the input signal DIN received by the signal receiver 100 according to an embodiment of the inventive concept is a differential signal, two reference voltages Vref1_opt and Vref2_opt may be used to identify two bit values (i.e., one of four input signal states). For convenience of description, below, the input signal DIN is assumed as a differential signal, but the inventive concept is not limited thereto.

The clock generator 114 may generate a clock signal CK. The clock signal CK may be provided to the first to third comparators 112a to 112c, and the first to third comparators 112a to 112c may perform the above comparison operations in synchronization with the clock signal CK.

In an exemplary embodiment, the first and second reference voltages Vref1_opt and Vref2_opt2 may be reference voltages generated by the reference voltage generator 120 described with reference to FIG. 3.

In an exemplary embodiment, the data sampler 110 of FIG. 4 may be configured to sample an input signal through a single path, but the inventive concept is not limited thereto. For example, the data sampler 110 may be configured to determine bit values of an input signal through various decoding schemes, for example, through an even path/odd path scheme.

Figure 5:
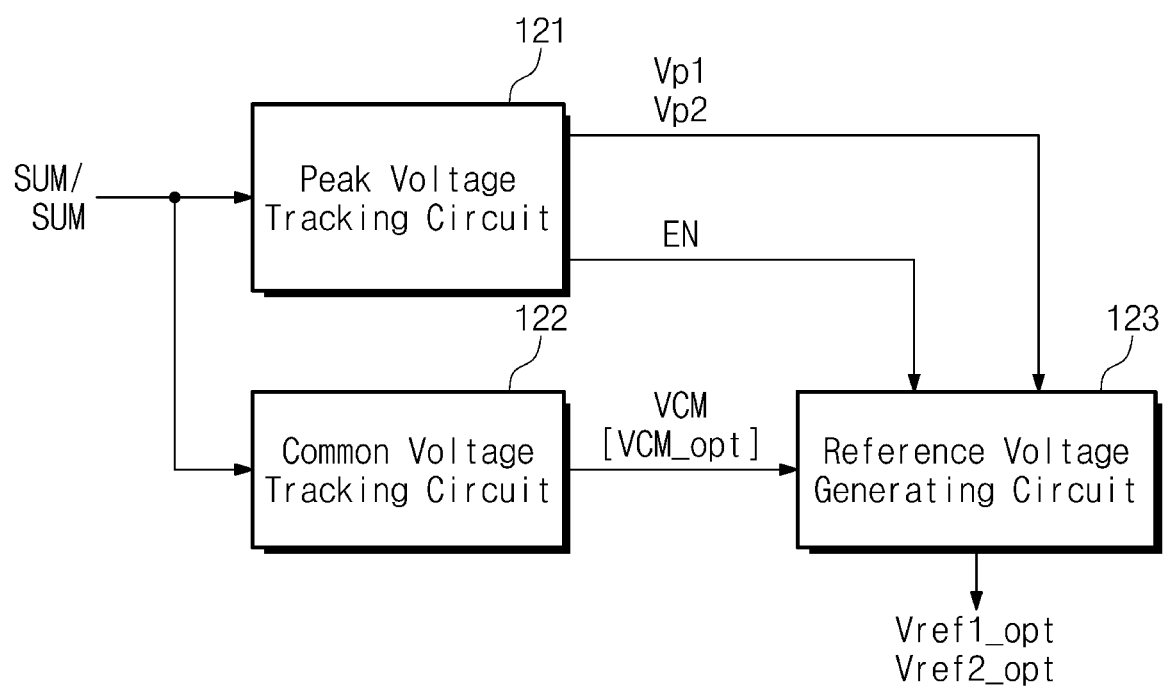
FIG. 5 is a block diagram illustrating a reference voltage generator of FIG. 3.

FIG. 5 is a block diagram illustrating a reference voltage generator of FIG. 3. Below, for convenience of description, the reference voltage generator 120 receives signals (i.e., SUM, /SUM) pre-processed by the data sampler 110, but the inventive concept is not limited thereto. For example, the reference voltage generator 120 may use the input signal DIN, as received, being a differential signal instead of the pre-processed signals (i.e., SUM, /SUM).

Referring to FIGS. 1, 3, and 5, the reference voltage generator 120 may include a peak voltage tracking circuit 121, a common voltage tracking circuit 122, and a reference voltage tracking circuit 123.

The peak voltage tracking circuit 121 may track first and second peak voltages Vp1 and Vp2 based on the pre-processed signals SUM and /SUM. For example, the first peak voltage Vp1 may indicate an upper limit level of the pre-processed signals SUM and /SUM, and the second peak voltage Vp2 may indicate a lower limit level of the pre-processed signals SUM and /SUM. In an exemplary embodiment, the first peak voltage Vp1 may correspond to the first voltage Va of FIG. 2A, and the second peak voltage Vp2 may correspond to the fourth voltage Vd of FIG. 2A. The peak voltage tracking circuit 121 may track the first and second peak voltages Vp1 and Vp2 and may then output an enable signal EN.

The common voltage tracking circuit 122 may generate the common voltage VCM or an optimized common voltage VCM_opt based on the pre-processed signals SUM and /SUM. In an exemplary embodiment, the common voltage VCM_opt may be defined as an intermediate level or an average level of the pre-processed signals SUM and /SUM. Without any other tracking technique, the common voltage tracking circuit 122 may generate an intermediate value of the pre-processed signals SUM and /SUM as the common voltage VCM or the optimized common voltage VCM_opt.

The reference voltage tracking circuit 123 may receive the first and second peak voltages Vp1 and Vp2 from the peak voltage tracking circuit 121 and may receive the common voltage VCM_opt from the common voltage tracking circuit 122. The reference voltage tracking circuit 123 may track or generate the first and second reference voltages Vref1_opt and Vref2_opt based on the received voltages Vp1, Vp2, and VCM_opt. A configuration and an operation of the reference voltage tracking circuit 123 will be more fully described with reference to drawings below.

Figure 6:
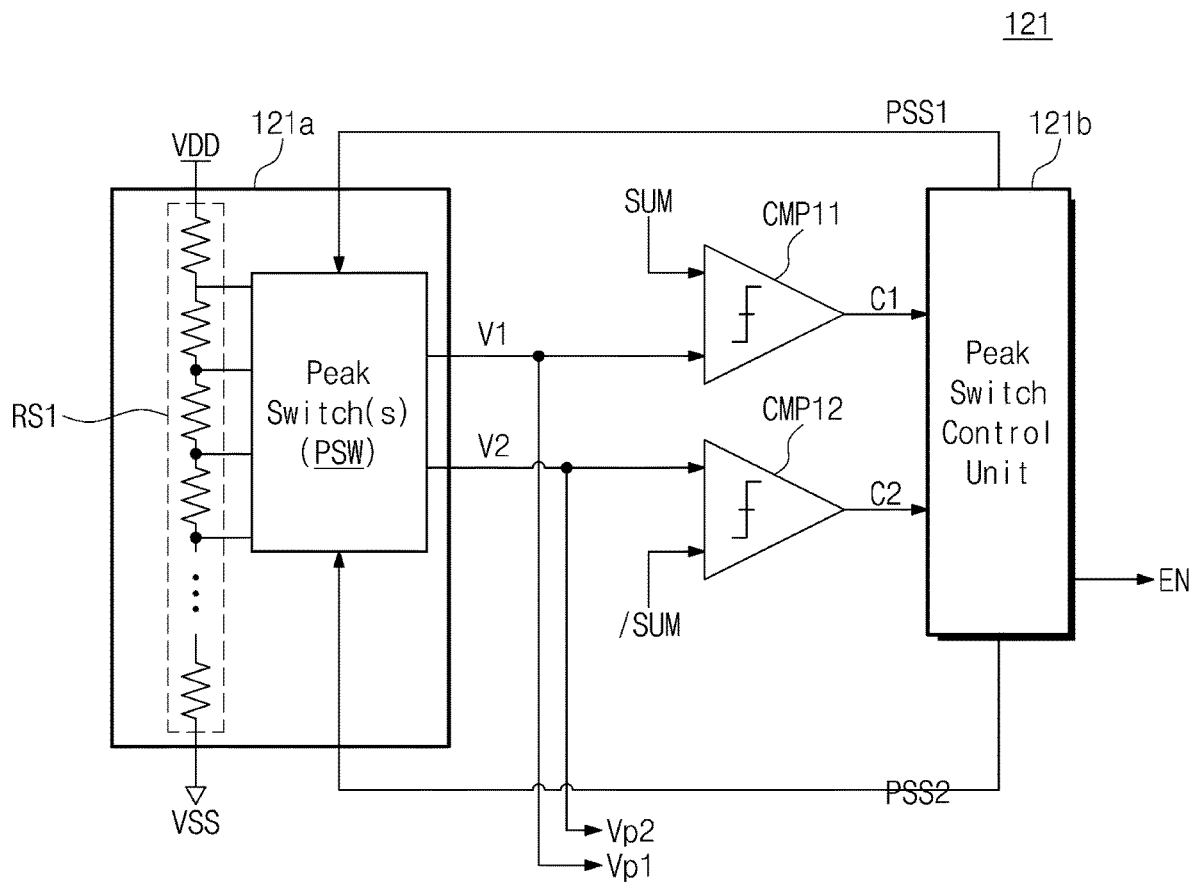
FIG. 6 is a block diagram illustrating a peak voltage tracking circuit of FIG. 5.

FIG. 6 is a block diagram illustrating the peak voltage tracking circuit of FIG. 5. Referring to FIGS. 5 and 6, the peak voltage tracking circuit 121 may include a first voltage dividing unit 121a (i.e., a first voltage divider), a peak switch control unit 121b (i.e., a peak switch control circuit), a first comparing unit CMP11 (i.e., a first comparator), and a second comparing unit CMP12 (i.e., a second comparator).

The first voltage dividing unit 121a may include a first resistor string RS1 and a peak switch PSW. The first resistor string RS1 may include a plurality of resistors that are connected in series between a power supply voltage VDD and a ground voltage VSS. The peak switch PSW may be configured to output a voltage V1 of a first node and a voltage V2 of a second node through switching between the plurality of resistors in the first resistor string RS1. The peak switch PSW may perform the above switching operation in response to a first peak switching signal PSS1 and a second peak switching signal PSS2 from the peak switch control unit 121b. The voltage V1 of the first node may be outputted as the first peak voltage Vp1, and the voltage V2 of the second node may be outputted as the second peak voltage Vp2.

The first comparing unit CMP11 may be configured to compare the first pre-processed signal SUM and the first peak voltage Vp1 and to output a first comparison value C1 as a comparison result. The second comparing unit CMP12 may be configured to compare the second pre-processed signal /SUM and the second peak voltage Vp2 and to output a second comparison value C2 as a comparison result.

The peak switch control unit 121b may generate the first peak switching signal PSS1 and the second peak switching signal PSS2 based on the first comparison value C1 of the first comparing unit CMP11 and the second comparison value C2 of the second comparing unit CMP12. For example, when the first comparison value C1 of the first comparing unit CMP11 indicates that the voltage V1 of the first node is lower than an upper limit level of the first pre-processed signal SUM, the peak switch control unit 121b may generate the first peak switching signal PSS1 such that the voltage V1 of the first node increases. The peak switch PSW may perform a switching operation in response to the first peak switching signal PSS1 such that the voltage V1 of the first node increases.

When the second comparison value C2 of the second comparing unit CMP12 indicates that the voltage V2 of the second node is higher than a lower limit level of the second pre-processed signal /SUM, the peak switch control unit 121b may generate the second peak switching signal PSS2 such that the voltage V2 of the second node decreases. The peak switch PSW may perform a switching operation in response to the second peak switching signal PSS2 such that the voltage V2 of the second node decreases.

When the voltage V1 of the first node is equal to the upper limit level of the first pre-processed signal SUM, the first voltage V1 of the first node may be decided as the first peak voltage Vp1. When the voltage V2 of the second node is equal to the lower limit level of the second pre-processed signal /SUM, the voltage V2 of the second node may be decided as the second peak voltage Vp2.

The peak voltage tracking circuit 121 may track or generate the first peak voltage Vp1 and the second peak voltage Vp2 by repeatedly performing the comparison operation and the switching operation described above. When the first and second peak voltages Vp1 and Vp2 are completely tracked (i.e., determined), the peak switch control unit 121b may output the enable signal EN. In an exemplary embodiment, the enable signal EN, the first peak voltage Vp1, and the second peak voltage Vp2 may be provided to the reference voltage tracking circuit 123.

An embodiment in which the first and second peak voltages Vp1 and Vp2 are tracked or generated by using the first voltage dividing unit 121a including the first resistor string RS1 and the peak switch PSW is described above, but the inventive concept is not limited thereto. For example, the peak voltage tracking circuit 121 may track or generate the first and second peak voltages Vp1 and Vp2 by using various types of voltage generators configured to stepwise increase/decrease an output voltage.

Figure 7:
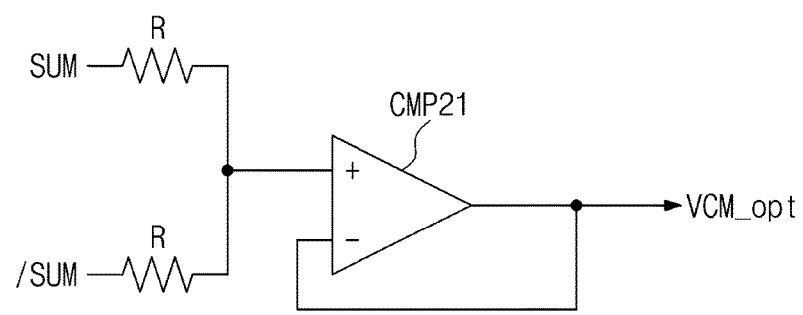
FIG. 7 is a diagram illustrating a common voltage tracking circuit of FIG. 5.

FIG. 7 is a diagram illustrating a common voltage tracking circuit of FIG. 5. Below, for brevity of illustration and for convenience of description, resistance elements may be expressed by using reference sign "R". In this case, "R" may indicate a resistance element or may indicate a resistance value of the resistance element. A resistance value of a resistance element marked by "2R" may be two times a resistance value of a resistance element marked by "R".

Referring to FIGS. 5 and 7, the common voltage tracking circuit 122 may include two resistors "R" and a comparing unit CMP21 (i.e., comparator). The first pre-processed signal SUM may be input to a first input terminal (+) of the comparing unit CMP21 through one resistor "R", and the second pre-processed signal /SUM may be input to the first input terminal (+) of the comparing unit CMP21 through the other resistor "R". A voltage of the first input terminal (+) of the comparing unit CMP21 may correspond to an average voltage of the first and second pre-processed signals SUM and /SUM, which corresponds to a value of (SUM+/SUM)/2.

An output terminal of the comparing unit CMP21 may be connected with a second input terminal (−) of the comparing unit CMP21. The comparing unit CMP21 may be implemented with a unity gain buffer. An output of the comparing unit CMP21 may be the common voltage VCM_opt.

As described above, the common voltage or optimal common voltage VCM_opt may be an intermediate value or an average value of the input signal DIN or the pre-processed signals SUM and /SUM. The optimal common voltage VCM_opt may be expressed by Equation 1 below.

$$\text{VCM\_opt} = \frac{SUM + /SUM}{2} \qquad [\text{Equation 1}]$$

Reference signs included in Equation 1 above are described above, and thus, additional description will be omitted to avoid redundancy. As described above, because the first and second pre-processed signals SUM and /SUM are differential signals, the common voltage or optimal common voltage VCM_opt may be generated by using the first and second pre-processed signals SUM and /SUM without a separate tracking operation. The optimal common voltage VCM_opt may be provided to the reference voltage tracking circuit 123.

Figure 8:
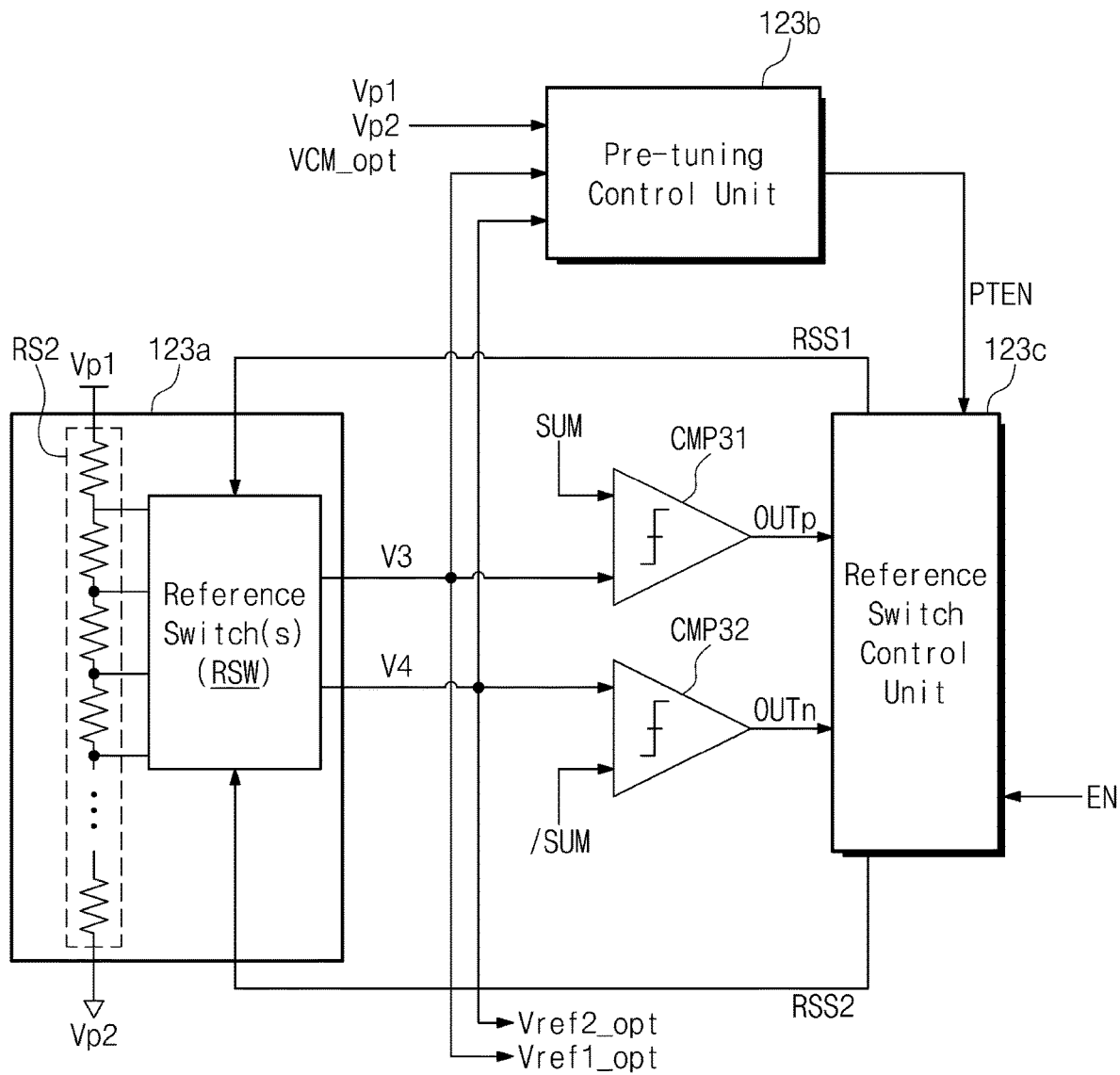
FIG. 8 is a diagram illustrating a reference voltage tracking circuit of FIG. 5.
Figure 9:
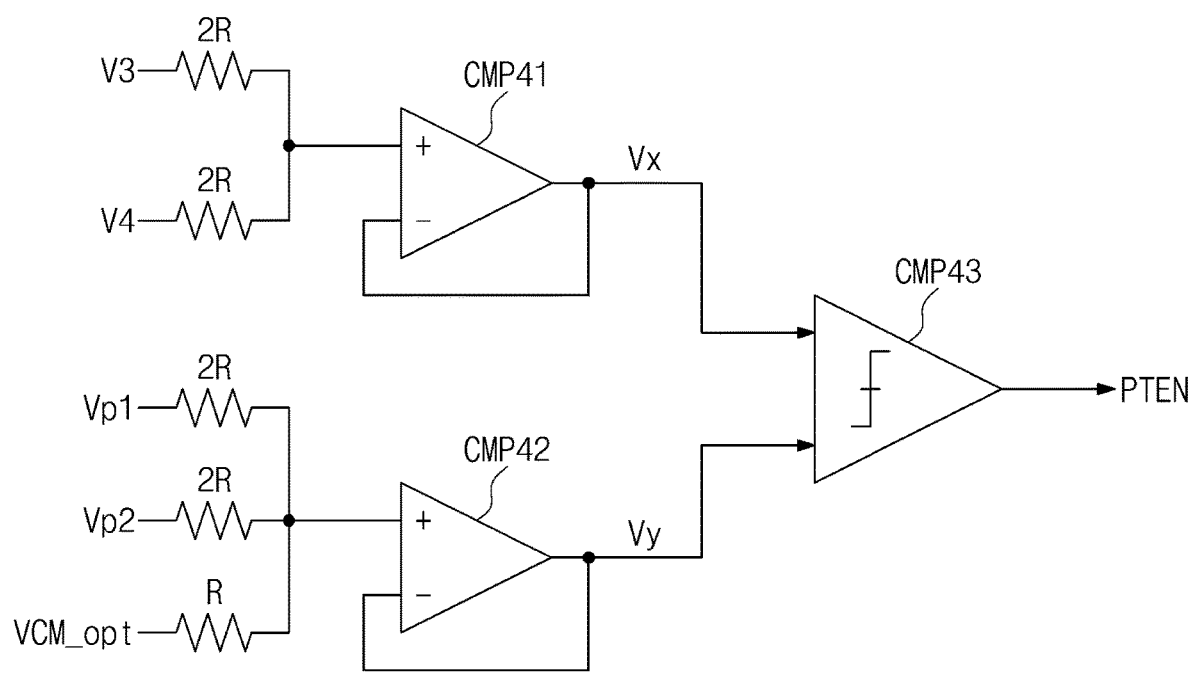
FIG. 9 is a diagram illustrating a pre-tuning control unit of FIG. 8.

FIG. 8 is a diagram illustrating a reference voltage tracking circuit of FIG. 5. FIG. 9 is a diagram illustrating a pre-tuning control unit of FIG. 8. Referring to FIGS. 5, 8, and 9, the reference voltage tracking circuit 123 may include a second voltage dividing unit 123a (i.e., a second voltage divider), a pre-turning control unit 123b (i.e., a pre-tuning control circuit), a reference switch control unit 123c (i.e., a reference switch control circuit), and first and second comparing units CMP31 and CMP32 (i.e., first and second comparators).

The second voltage dividing unit 123a may include a second resistor string RS2 and a reference switch RSW. The second resistor string RS2 may include a plurality of resistors that are connected in series between the first peak voltage Vp1 and the second peak voltage Vp2. The reference switch RSW may be configured to output a voltage V3 of a third node and a voltage V4 of a fourth node through switching between the plurality of resistors in the second resistor string RS2. The reference switch RSW may perform a switching operation to output the voltages V3 and V3 in response to a first reference switching signal RSS1 and a second reference switching signal RSS2 from the reference switch control unit 123c.

The pre-turning control unit 123b may output a pre-tuning signal PTEN based on the first peak voltage Vp1, the second peak voltage Vp2, the common voltage VCM_opt, the voltage V3 of the third node, and the voltage V4 of the fourth node. For example, in FIG. 2B that shows the 4-level pulse amplitude modulation PAM-4' where distortion occurs, assuming that each of the optimal reference voltages Vref1_otp, VCM_opt, and Vref2_otp is an intermediate value of a corresponding data eye, Equation 2 below may be established.

$$Vref1\_opt = \frac{Va' + Vb'}{2}$$
$$VCM\_opt = \frac{Vb' + Vc'}{2}$$ [Equation 2]
$$Vref2\_opt = \frac{Vc' + Vd'}{2}$$

Reference signs included in Equation 2 above are described above, and thus, additional description will be omitted to avoid redundancy. In Equation 2 above, Va' may be the first peak voltage Vp1, and Vd' may be the second peak voltage Vp2. Equation 3 below may be established by summarizing Equation 2 above.

$$Vref1\_opt + Vref2\_opt = VCM\_opt + \frac{Vp1 + Vp2}{2}$$ [Equation 3]

Reference signs included in Equation 3 above are described above, and thus, additional description will be omitted to avoid redundancy. In Equation 3, a sum of the first and second reference voltages Vref1_opt and Vref2_opt may be equal to a sum of an average of the first and second peak voltages Vp1 and Vp2 and the common voltage VCM_opt. The first and second peak values Vp1 and Vp2, and the common voltage VCM_opt of the right-hand side of Equation 3 above are values decided by the peak voltage tracking circuit 121 and the common voltage tracking circuit 122, and thus a sum of the first and second reference voltages Vref1_opt and Vref2_opt may be decided.

The pre-turning control unit 123b may be configured to compare a sum of the voltage V3 of the third node and the voltage V4 of the fourth node and a sum of the common voltage VCM_opt and an average of the first peak voltage Vp1 and the second peak voltage Vp2 and to output a pre-tuning signal PTEN as the comparison result.

In an exemplary embodiment, in the case where the pre-turning control unit 123b is implemented on a basis of Equation 3, because a sum of the first and second reference voltages Vref1_opt and Vref2_opt may exceed the power supply voltage VDD, the pre-turning control unit 123b may be implemented based on a result of halving both sides of Equation 3.

For example, as illustrated in FIG. 9, the pre-turning control unit 123b may include a plurality of resistors "R" and 2R and comparators CMP41, CMP42, and CMP43.

Each of the voltage V3 of the third node and the fourth voltage V4 of the fourth node, which are output from the reference switch RSW, may be input to a first input terminal (+) of the comparator CMP41 through the corresponding resistor 2R, and an output Vx of the comparator CMP41 may be input to a second input terminal (−) of the comparator CMP41. The comparator CMP41 may be implemented with a unity gain buffer. The output Vx of the comparator CMP41 is referred to as a "first intermediate voltage". In an exemplary embodiment, the voltage V3 of the third node may correspond to the first reference voltage Vref1_opt in Equation 3 above, and the voltage V4 of the fourth node may correspond to the second reference voltage Vref2_opt in Equation 3 above. The first intermediate value Vx may be a value corresponding to a result of halving the left-hand side of Equation 3 above (i.e., an average value of the first reference voltage Vref1_opt and the second reference voltage Vref2_opt).

Each of the first peak voltage Vp1 and the second peak voltage Vp2 output from the peak voltage tracking circuit 121 may be input to a first input terminal (+) of the comparator CMP42 through the corresponding resistor 2R, the common voltage VCM_opt from the common voltage tracking circuit 122 may be input to the first input terminal (+) of the comparing unit CMP42 through the resistor "R", and an output Vy of the comparator CMP42 may be input to a second input terminal (−) of the comparator CMP42. The comparator CMP42 may be implemented with a unity gain buffer. The output Vy of the comparator CMP42 is referred to as a "second intermediate voltage". The second intermediate voltage Vy may be a value corresponding to a result of halving the right-hand side of Equation 3 above (i.e., an average value of the common voltage VCM_opt and an average value of the first peak voltage Vp1 and the second peak voltage Vp2).

The comparator CMP43 may compare the first intermediate voltage Vx and the second intermediate voltage Vy and may output the pre-tuning signal PTEN depending on a comparison result. When the first intermediate voltage Vx and the second intermediate voltage Vy are different, the pre-tuning signal PTEN may be enabled. In an exemplary embodiment, when the first intermediate voltage Vx is higher than (or greater than) the second intermediate voltage Vy, the pre-tuning signal PTEN may be output such that pre-tuning is performed based on a first mode. When the first intermediate voltage Vx is lower than (or smaller than) the second intermediate voltage Vy, the pre-tuning signal PTEN may be output such that pre-tuning is performed based on a second mode. In an exemplary embodiment, a mode for pre-tuning may be variously changed depending on initial values of the third and fourth voltages V3 and V4 and the common voltage VCM_opt. The mode for pre-tuning will be more fully described with reference to FIGS. 11A to 11D.

Returning to FIG. 8, the first comparing unit CMP31 (i.e., a first comparator) may compare the voltage V3 of the third node and the first pre-processed signal SUM and may output a first comparison result OUTp. The second comparing unit CMP32 (i.e., a second comparator) may compare the voltage V4 of the fourth node and the second pre-processed signal /SUM and may output a second comparison result OUTn.

The reference switch control unit 123c may generate the first and second reference switching signals RSS1 and RSS2 in response to the enable signal EN from the peak voltage tracking circuit 121. The reference switch control unit 123c may generate the first and second reference switching signals RSS1 and RSS2 based on the pre-tuning signal PTEN, the first comparison result OUTp, and the second comparison result OUTn.

For example, first, the reference switch control unit 123c starts an operation of tracking a reference voltage in response to the enable signal EN. When the first intermediate voltage Vx and the second intermediate voltage Vy of the pre-turning control unit 123b are different, the pre-tuning signal PTEN may be output (i.e., enabled). The reference switch control unit 123c may generate one of the first and second reference switching signals RSS1 and RSS2 based on the pre-tuning signal PTEN. In an exemplary embodiment, when the first intermediate voltage Vx is higher than the second intermediate voltage Vy, the pre-tuning signal PTEN may correspond to the first mode where the reference switch control unit 123c may generate the first reference switching signal RSS1 such that the voltage V3 of the third node decreases. The reference switch RSW may decrease the voltage V3 of the third node in response to the first reference switching signal RSS1. When the first intermediate voltage Vx is lower than the second intermediate voltage Vy, the pre-tuning signal PTEN may correspond to the second mode where the reference switch control unit 123c may generate the second reference switching signal RSS2 such that the voltage V4 of the fourth node increases. The reference switch RSW may increase the voltage V4 of the fourth node in response to the second reference switching signal RSS2. The above configurations are only examples, and the first and second reference switching signals RSS1 and RSS2 that are generated in response to the pre-tuning signal PTEN may be variously changed or modified depending on various conditions (e.g., a magnitude of the common voltage VCM_opt and initial values of the third and fourth voltages V3 and V4).

The reference switch control unit 123c may repeat the above operations until the first intermediate voltage Vx and the second intermediate voltage Vy of the pre-turning control unit 123b are equal. When the first intermediate voltage Vx and the second intermediate voltage Vy of the pre-turning control unit 123b are equal, the pre-tuning signal PTEN may be disabled. In this case, the reference switch control unit 123c may generate the first and second reference switching signals RSS1 and RSS2 based on the first and second comparison results OUTp and OUTn from the comparing units CMP31 and CMP32. For example, when the first and second comparison results OUTp and OUTn from the comparing units CMP31 and CMP32 are different, the reference switch control unit 123c may generate the first reference switching signal RSS1 such that the voltage V3 of the third node increases/decreases and may generate the second reference switching signal RSS2 such that the voltage V4 of the fourth node decreases/increases. In an exemplary embodiment, an increment/decrement of the voltage V3 of the third node may be equal to a decrement/increment of the voltage V4 of the fourth node, such that a magnitude of the first intermediate voltage Vx of the pre-turning control unit 123b does not change. That is, an increment/decrement of the third voltage V3 and a decrement/increment of the fourth voltage V4 may be set to the same magnitude (or unit magnitude).

The reference switch control unit 123c may repeat the above operations until the first and second comparison results OUTp and OUTn from the comparing units CMP31 and CMP32 are identical. In an exemplary embodiment, when the first and second comparison results OUTp and OUTn from the comparing units CMP31 and CMP32 are identical, the voltage V3 of the third node may be decided as the first reference voltage Vref1_opt, and the voltage V4 of the fourth node may be decided as the second reference voltage Vref2_opt.

As described above, the reference voltage tracking circuit 123 may track or generate the optimal reference voltages Vref1_opt and Vref2_opt by controlling one of the third and fourth voltages V3 and V4 based on the pre-tuning signal PTEN from the pre-turning control unit 123b (i.e., a result of comparing the first and second intermediate voltages Vx and Vy) and then controlling the third and fourth voltages V3 and V4 based on the first and second comparison results OUTp and OUTn from the comparing units CMP31 and CMP32, respectively. In an exemplary embodiment, the optimal reference voltages Vref1_opt and Vref2_opt may be used to determine the output data DOUT associated with the input signal DIN at the data sampler 110 described with reference to FIG. 4.

Figure 10:
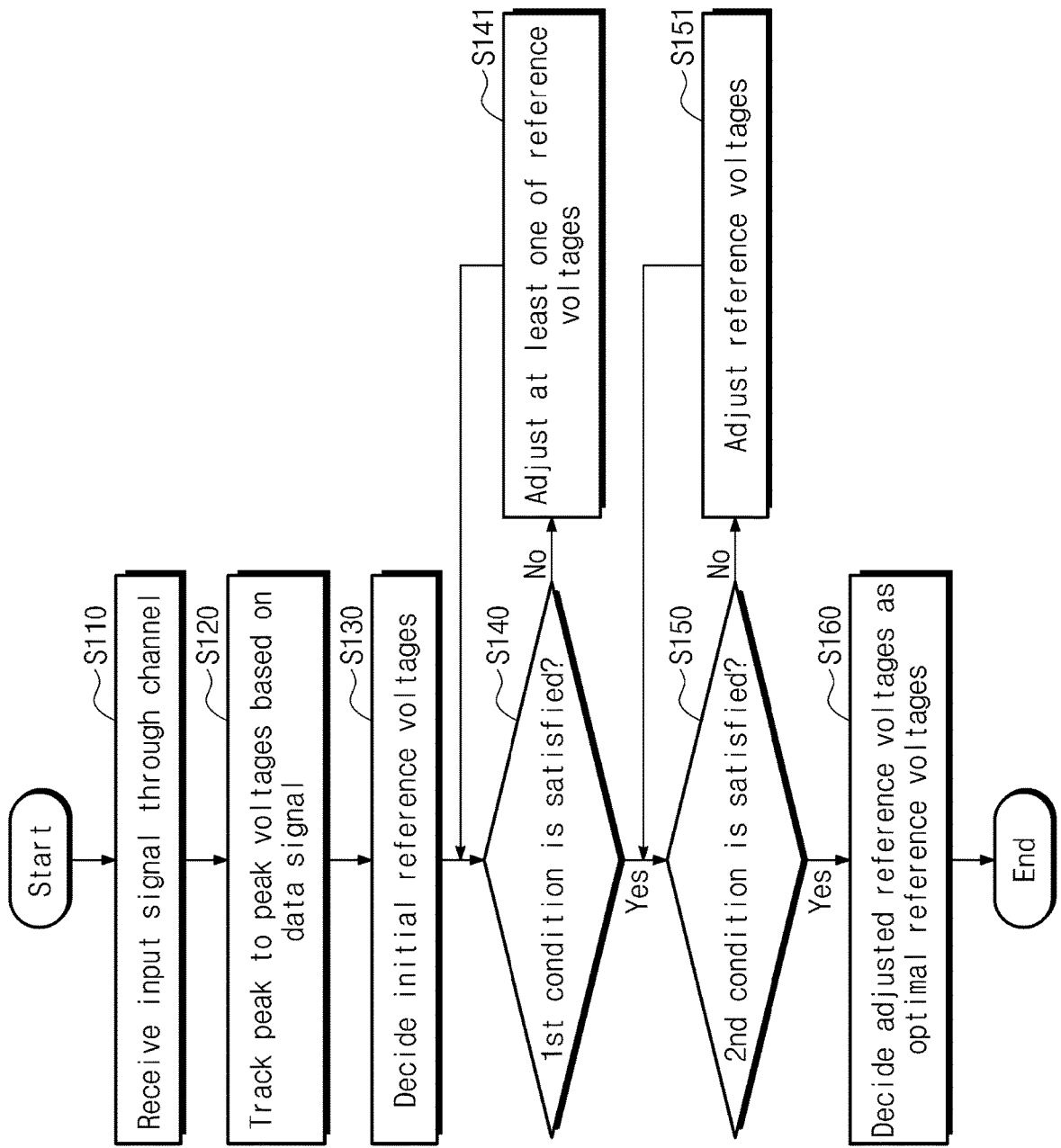
FIG. 10 is a flowchart illustrating an operation of a signal receiver of FIG. 3.

FIG. 10 is a flowchart illustrating an operation of a signal receiver of FIG. 3. For convenience of description, additional description associated with the components described above will be omitted to avoid redundancy. Below, the description will be given as an operation according to the flowchart of FIG. 10 is performed by the signal receiver 100 of FIG. 3, but the inventive concept is not limited thereto. For example, the operation according to the flowchart of FIG. 10 may be performed by the reference voltage generator 120 or any other electronic devices.

Below, for convenience of description, a configuration where the signal receiver 100 generates reference voltages based on the input signal DIN will be described. However, the inventive concept is not limited thereto. For example, as described above, reference voltages may be tracked or generated by using the pre-processed signals SUM and /SUM that are obtained by pre-processing the input signal DIN.

Referring to FIGS. 1 and 3 to 10, in operation S110, the signal receiver 100 may receive the input signal DIN through the channel CH. In an exemplary embodiment, the input signal DIN that is a differential signal may be a signal modulated through the 4-level pulse amplitude modulation PAM-4.

In operation S120, the signal receiver 100 may track or generate the peak voltages (i.e., Vp1 and Vp2) based on the input signal DIN. The first peak voltage Vp1 may be a voltage corresponding to the upper limit level (i.e., the highest voltage level) of the input signal DIN, and the second peak voltage Vp2 may be a voltage corresponding to the lower limit level (i.e., the lowest voltage level) of the input signal DIN.

In operation S130, the signal receiver 100 may decide initial voltages of the third and fourth voltages V3 and V4 described with reference to FIG. 8 to track or generate the reference voltages Vref1_opt and Vref2_opt. For example, a first initial voltage of the voltage V3 of the third node may be set to "$\frac{2}{3}$*(Vp1+Vp2)", and a second initial voltage of the voltage V4 of the fourth node may be set to "$\frac{1}{3}$*(Vp1+Vp2)". Alternatively, the first and second initial voltages of the third and fourth voltages V3 and V4 may be set to the same voltage of "$\frac{1}{2}$*(Vp1+Vp2)". Alternatively, the first initial voltage for the voltage V3 of the third node may be set to the first peak voltage Vp1, and the second initial voltage for the voltage V4 of the fourth node may be set to the second peak voltage Vp2. However, the inventive concept is not limited thereto. For example, the initial reference voltages for the third and fourth voltages V3 and V4 may be variously set in a range from the first peak voltage Vp1 to the second peak voltage Vp2.

In operation S140, the signal receiver 100 may determine whether a first condition is satisfied. For example, the first condition may indicate a condition based on Equation 3 above. The first condition may indicate a condition at which the first intermediate voltage Vx and the second intermediate voltage Vy described with reference to FIG. 9 are equal.

When the first condition is not satisfied, in operation S141, the signal receiver 100 may adjust one of the reference voltages. For example, as described with reference to FIGS. 8 and 9, when the condition (i.e., Vx=Vy) based on Equation 3 above is not satisfied, at least one of the voltage V3 of the third node and the voltage V4 of the fourth node may be adjusted such that the condition (i.e., Vx=Vy) based on Equation 3 above is satisfied. In an exemplary embodiment, the signal receiver 100 may repeatedly perform operation S140 and operation S141 until the first condition (i.e., Vx=Vy) is satisfied.

When the first condition is satisfied, in operation S150, the signal receiver 100 may determine whether a second condition is satisfied. For example, the second condition may indicate a condition at which the first and second comparison results OUTp and OUTn of the comparing units CMP31 and CMP32 described with reference to FIG. 8 are identical.

When the second condition is not satisfied, in operation S151, the signal receiver 100 may adjust the reference voltages. For example, as described with reference to FIG. 8, the reference switch control unit 123c may generate the first and second reference switching signals RSS1 and RSS2 such that the first and second comparison results OUTp and OUTn from the comparing units CMP31 and CMP32 are identical. In this case, the first reference switching signal RSS1 may be generated such that the voltage V3 of the third node increases/decreases, and the second reference switching signal RSS2 may be generated such that the voltage V4 of the fourth node decreases/increases. In an exemplary embodiment, the increment/decrement of the voltage V3 of the third node may be equal to the decrement/increment of the voltage V4 of the fourth node. This may be for maintaining the satisfaction of the first condition.

When the second condition is satisfied, in operation S160, the signal receiver 100 may decide the adjusted reference voltages as optimal reference voltages (i.e., Vref1_opt and Vref2_opt).

In an exemplary embodiment, the signal receiver 100 may determine bit values of the input signal DIN or bit values of any other signal(s) received following the input signal DIN, by using the optimal reference voltages Vref1_opt and Vref2_opt thus decided.

In an exemplary embodiment, operation S140 and operation S141 may indicate a pre-tuning operation or a coarse tuning operation of the signal receiver 100 or the reference voltage generator 120, and operation S150 and operation S151 may indicate a post-tuning operation or a fine tuning operation of the signal receiver 100 or the reference voltage generator 120.

FIGS. 11A to 11D are diagrams for describing how a signal receiver tracks an optimal reference voltage based on the flowchart of FIG. 10. For convenience of description, additional description associated with the components described above will be omitted to avoid redundancy. It is assumed that before an operation of tracking an optimal reference voltage is performed, the first and second peak voltages Vp1 and Vp2 are decided by the peak voltage tracking circuit 121 and the common voltage VCM_opt is decided by the common voltage tracking circuit 122. The first and second peak voltages Vp1 and Vp2 and the common voltage VCM_opt are decided based on the input signal DIN and the pre-processed signals SUM and /SUM as described with reference to FIGS. 6 and 7, and thus, additional description will be omitted to avoid redundancy.

Figure 11A:
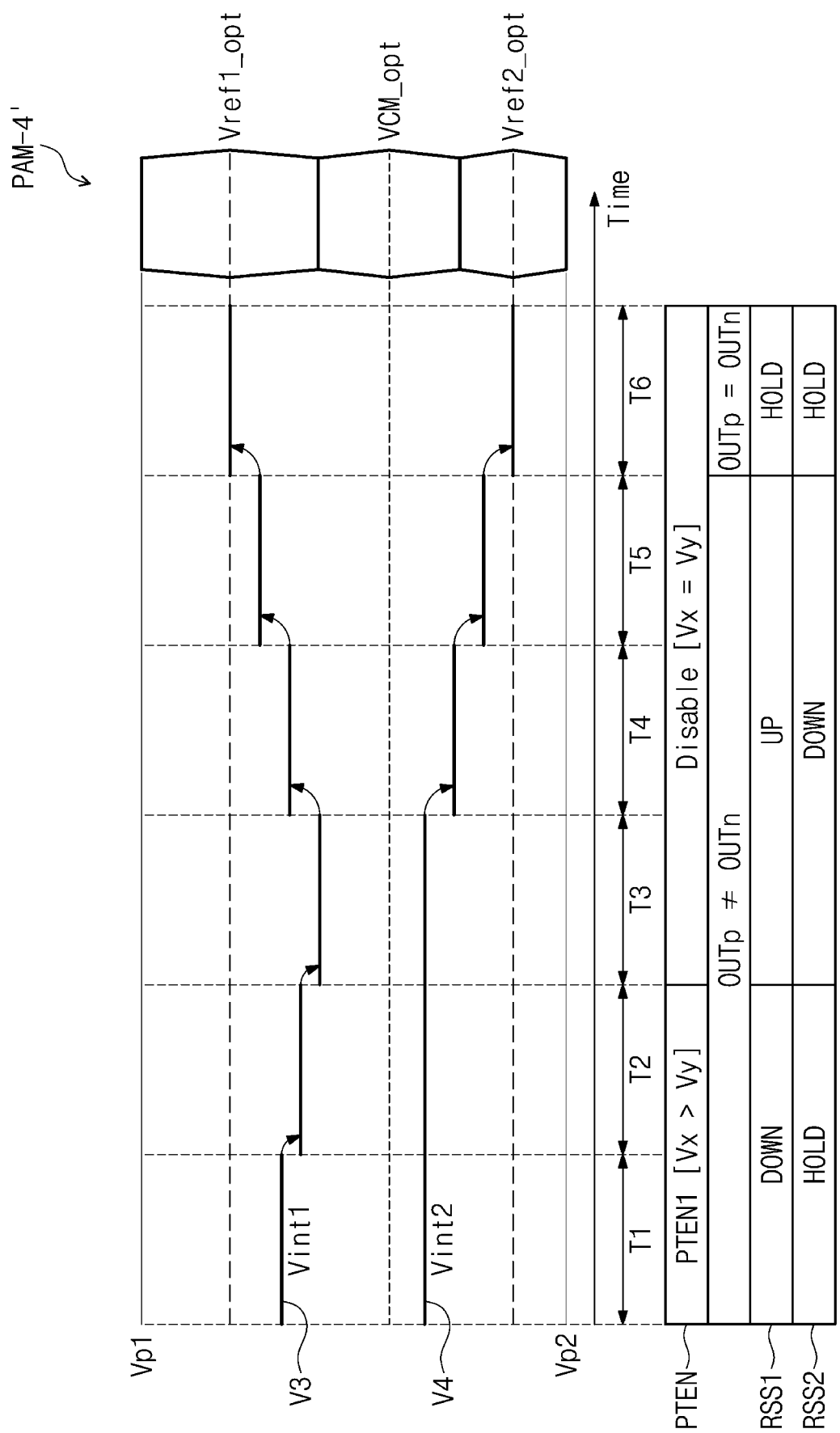
FIGS. 11A to 11D are diagrams for describing how a signal receiver tracks an optimal reference voltage based on the flowchart of FIG. 10.

First, referring to FIGS. 8, 9, and 11A, it is assumed that the received input signal DIN has a waveform of the 4-level pulse amplitude modulation PAM-4' as illustrated in FIG. 11A. In this case, compared to the ideal 4-level pulse amplitude modulation PAM-4, the 4-level pulse amplitude modulation PAM-4' may have a data eye that is downward distorted (i.e., a data eye where all optimal reference voltages decrease). For the 4-level pulse amplitude modulation PAM-4', first and second reference voltages that are optimized for the 4-level pulse amplitude modulation PAM-4' may be Vref1_opt and Vref2_opt.

First, during a first time T1, an initial voltage of the voltage V3 of the third node may be set to a first initial voltage Vint1, and an initial voltage of the voltage V4 of the fourth node may be set to a second initial voltage Vint2. The first initial voltage Vint1 may correspond to a voltage of "⅔*(Vp1+Vp2)", and the second initial voltage Vint2 may correspond to a voltage of "⅓*(Vp1+Vp2)".

During a second time T2, the first intermediate voltage Vx corresponding to a sum of the voltage V3 of the third node and the voltage V4 of the fourth node may be greater than the second intermediate voltage Vy (i.e., VCM_opt+(Vp1+Vp2)/2) due to the downward distortion of the 4-level pulse amplitude modulation PAM-4' compared to the ideal 4-level pulse amplitude modulation PAM-4. In this case, the pre-turning control unit 123b may output a first pre-tuning signal PTEN1, of the pre-tuning signal PTEN, corresponding to the first mode. The first mode may indicate a mode in which the voltage V3 of the third node from among the voltages V3 and V4 decreases step by step.

The reference switch control unit 123c may generate the first reference switching signal RSS1 in response to the first pre-tuning signal PTEN1 such that the voltage V3 of the third node decreases (i.e., DOWN) and may generate the second reference switching signal RSS2 in response to the first pre-tuning signal PTEN1 such that the voltage V4 of the fourth node is maintained (i.e., HOLD). The reference switch RSW may decrease the voltage V3 of the third node by a given magnitude in response to the first reference switching signal RSS1 indicating "DOWN" and may maintain the voltage V4 of the fourth node in response to the second reference switching signal RSS2 indicating "HOLD". During the first and second times T1 and T2, the voltage V4 of the fourth node may be identically maintained, and the voltage V3 of the third node in the second time T2 may be lower than the voltage V3 of the third node in the first time T1.

During the second time T2, the first intermediate voltage Vx may be greater than the second intermediate voltage Vy. In this case, as in the operation during the first time T1, the first reference switching signal RSS1 may be generated such that the voltage V3 of the third node decreases (i.e., DOWN), and the second reference switching signal RSS2 may be generated such that the voltage V4 of the fourth node is maintained (i.e., HOLD). As such, during a third time T3, the voltage V3 of the third node may decrease by the given magnitude, and the voltage V4 of the fourth node may be maintained. In response to the first pre-tuning signal PTEN1, during the first to third times T1 to T3, the voltage V3 of the third node may stepwise decrease, and the voltage V4 of the fourth node may be identically maintained.

During the third time T3, the first intermediate voltage Vx may be equal to the second intermediate voltage Vy. The first condition described with reference to operation S140 of FIG. 10 may be satisfied. In this case, the pre-turning control unit 123b may disable the pre-tuning signal PTEN.

As described above, because the first condition is satisfied, the reference switch control unit 123c may determine whether the second condition (i.e., OUTp=OUTn), is satisfied during the third time T3. As illustrated in FIG. 11A, during the third time T3, because the first comparison result OUTp and the second comparison result OUTn are different, the reference switch control unit 123c may generate the first reference switching signal RSS1 such that the voltage V3 of the third node increases (e.g., UP) and may generate the second reference switching signal RSS2 such that the voltage V4 of the fourth node decreases (e.g., DOWN). In response to the first and second reference switching signals RSS1 and RSS2, the reference switch RSW may increase the voltage V3 of the third node by the given magnitude and may decrease the voltage V4 of the fourth node by the given magnitude.

During fourth to sixth times T4 to T6, the reference voltage generator 120 may respectively perform operations similar to the operation performed during the third time T3 until the first comparison result OUTp and the second comparison result OUTn are identical. The reference voltage generator 120, during the fourth to sixth times T4 to T6, may stepwise increase the voltage V3 of the third node and may stepwise decrease the voltage V4 of the fourth node.

During the sixth time T6, the first comparison result OUTp and the second comparison result OUTn may be identical so that the second condition may be satisfied. That the first comparison result OUTp and the second comparison result OUTn are identical may mean that the voltage V3 of the third node and the voltage V4 of the fourth node are the optimal reference voltages Vref1_opt and Vref2_opt for the received input signal DIN. In a state where the first comparison result OUTp and the second comparison result OUTn are identical, the voltage V3 of the third node and the voltage V4 of the fourth node may be used as the first optimal reference voltage Vref1_opt and the second optimal reference voltage Vref2_opt, respectively.

In an exemplary embodiment, when the second condition is satisfied, the reference switch control unit 123c may generate the first and second reference switching signals RSS1 and RSS2 each having a value of "HOLD" to maintain the voltages V3 and V4 of the third and fourth nodes during the sixth time T6.

As described above, the reference voltage tracking circuit 123, in response to the pre-tuning signal PTEN1 during the first time T1, may set the voltages V3 and V4 of the third and fourth nodes to first and second initial values Vint1 and Vint2, respectively. In this case, when the first intermediate voltage Vx is greater than the second intermediate voltage Vy, the reference voltage generator 120 or the reference voltage tracking circuit 123 may stepwise decrease the voltage V3 of the third node until the first condition is satisfied and then may stepwise increase the voltage V3 of the third node and stepwise decrease the voltage V4 of the fourth node until the second condition is satisfied. The voltages V3 and V4 of the third and fourth nodes, at a time when the first and second conditions are satisfied, may be used as the optimal reference voltages Vref1_opt and Vref2_opt.

Figure 11B:
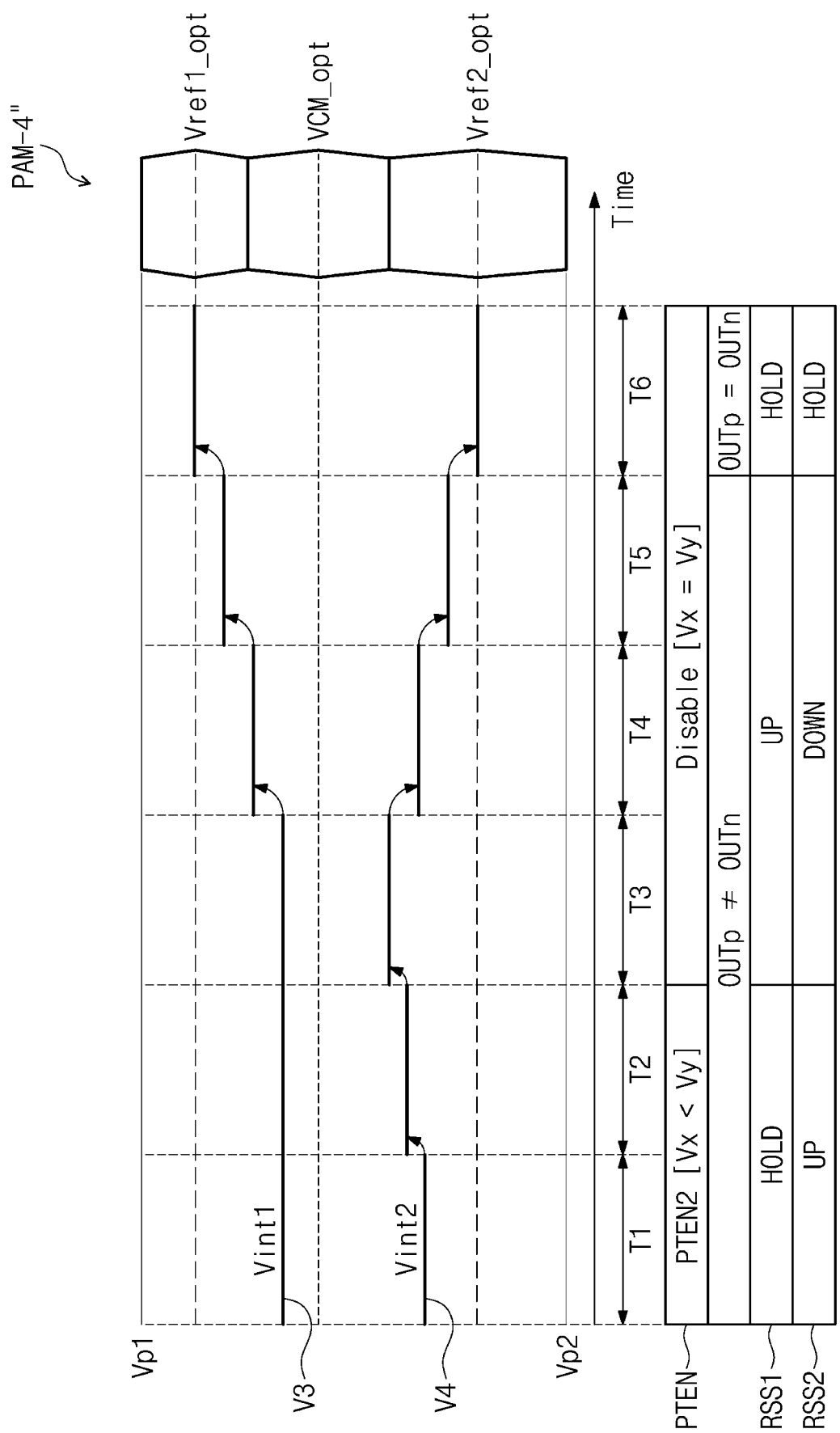

Next, referring to FIGS. 8, 9, and 11B, it is assumed that the received input signal DIN has a waveform of 4-level pulse amplitude modulation PAM-4" as illustrated in FIG. 11B. In this case, compared to the ideal 4-level pulse amplitude modulation PAM-4, the 4-level pulse amplitude modulation PAM-4" may have a data eye that is upward distorted (i.e., a data eye where all optimal reference voltages increase). Reference voltages that are optimized for the 4-level pulse amplitude modulation PAM-4" may be the first and second optimal reference voltages Vref1_opt and Vref2_opt.

Because an overall operation of FIG. 11B is similar to that described with reference to FIG. 11A, a difference between FIGS. 11A and 11B will be mainly described. As illustrated in FIG. 11B, during the first time T1, an initial voltage of the voltage V3 of the third node and an initial voltage of the voltage V4 of the fourth node may be respectively set to the first initial voltage Vint1 and the second initial voltage Vint2.

In this case, according to levels of signals V3, V4, Vp1, Vp2, and VCM_opt, the first intermediate voltage Vx may be lower than the second intermediate voltage Vy during the first time T1 of FIG. 11B due to the upward distortion of the 4-level pulse amplitude modulation PAM-4" of FIG. 11B compared to the ideal 4-level pulse amplitude modulation PAM-4. The pre-turning control unit 123b may output a second pre-tuning signal PTEN2, of the pre-tuning signal PTEN, corresponding to the second mode. The second mode may indicate a mode in which the voltage V4 of the fourth node from among the voltages V3 and V4 increases step by step.

During the first and second times T1 and T2, the reference switch control unit 123c may generate the first reference switching signal RSS1 indicating "HOLD" and the second reference switching signal RSS2 indicating "UP" based on the second pre-tuning signal PTEN2. During the second and third times T2 and T3, based on the first reference switching signal RSS1 indicating "HOLD" and the second reference switching signal RSS2 indicating "UP", the voltage V3 of the third node may be identically maintained, and the voltage V4 of the fourth node may stepwise increase.

During the third time T3, the first intermediate voltage Vx may be equal to the second intermediate voltage Vy so that the first condition may be satisfied. During the fourth to sixth times T4 to T6, the reference voltage generator 120 or the reference voltage tracking circuit 123 may stepwise increase the voltage V3 of the third node and may stepwise decrease the voltage V4 of the fourth node. This operation is similar to the operation described with reference to FIG. 11A, and thus, additional description will be omitted to avoid redundancy.

Figure 11C:
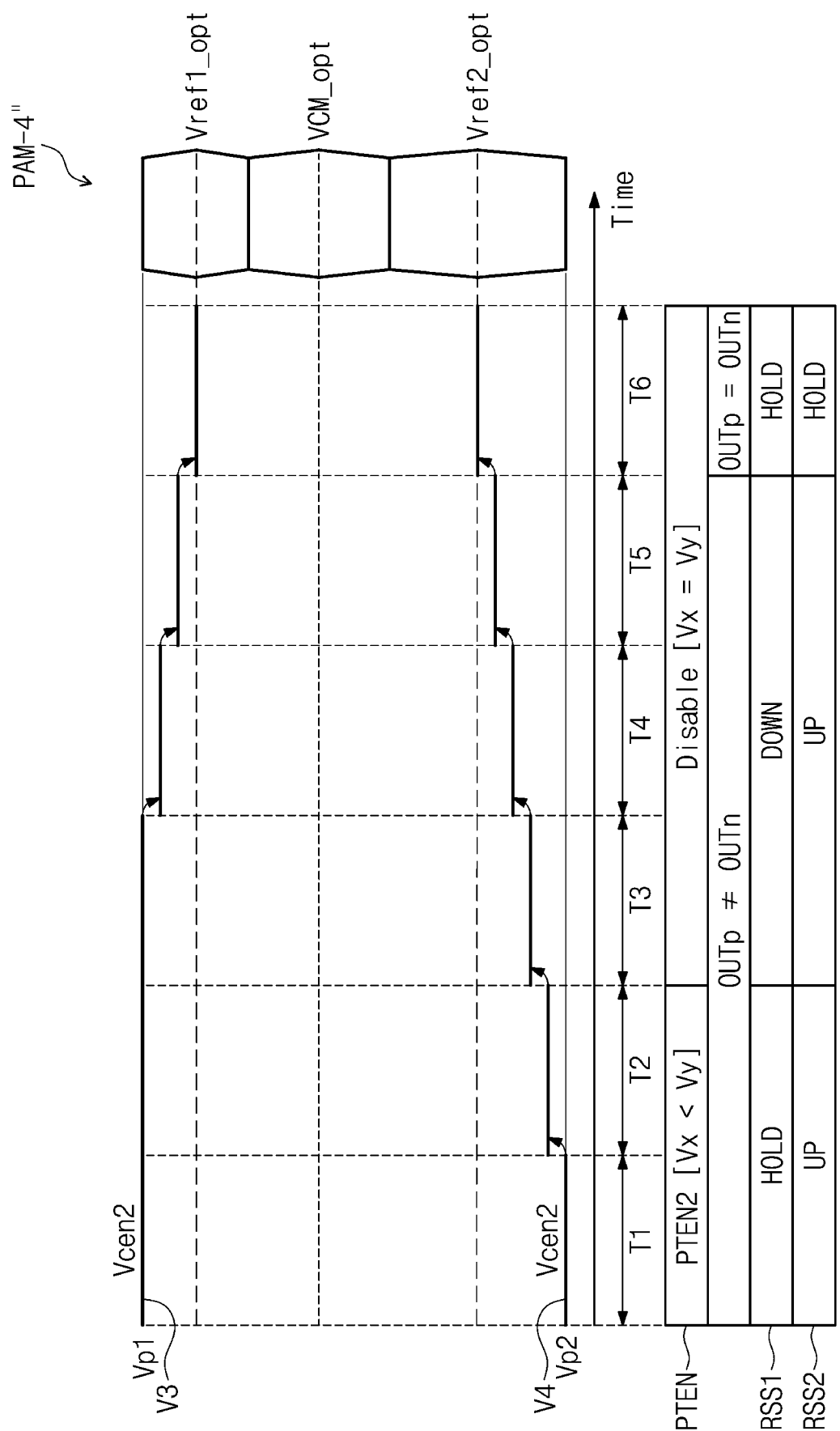

Then, referring to FIGS. 8, 9, and 11C, it is assumed that the received input signal DIN has a waveform of the 4-level pulse amplitude modulation PAM-4" as illustrated in FIG. 11C. In this case, compared to the ideal 4-level pulse amplitude modulation PAM-4, the 4-level pulse amplitude modulation PAM-4" may have a data eye that is upward distorted (i.e., a data eye where all optimal reference voltages increase). First and second reference voltages that are optimized for the PAM-4" may be first and second optimal reference voltages Vref1_opt and Vref2_opt.

Unlike the embodiments of FIGS. 11A and 11B, in FIG. 11C, an initial voltage of the voltage V3 of the third node may be set to the first peak voltage Vp1, and an initial voltage of the voltage V4 of the fourth node may be set to the second peak voltage Vp2.

During the first and second times T1 and T2, the first intermediate voltage Vx may be lower than the second intermediate voltage Vy, and thus, the second pre-tuning signal PTEN2 corresponding to the second mode may be generated. During the second and third times T2 and T3, the reference voltage generator 120 or the reference voltage tracking circuit 123 may stepwise increase the voltage V4 of the fourth node in response to the second pre-tuning signal PTEN2.

After the first condition is satisfied during the third time T3, the reference voltage generator 120 or the reference voltage tracking circuit 123 may generate the first reference switching signal RSS1 such that the voltage V3 of the third node stepwise decreases (i.e., DOWN) and may generate the second reference switching signal RSS2 such that the voltage V4 of the fourth node stepwise increases (i.e., UP). During the fourth to sixth times T4 to T6, the voltage V3 of the third node may stepwise decrease based on the first reference switching signal RSS1 indicating "DOWN, and the voltage V4 of the fourth node may stepwise increase based on the second reference switching signal RSS2 indicating "UP". The second condition may be satisfied during the sixth time T6, and the voltages V3 and V4 of the third and fourth nodes decided during the sixth time T6 may be used as the optimal reference voltages Vref1_opt and Vref2_opt.

Figure 11D:
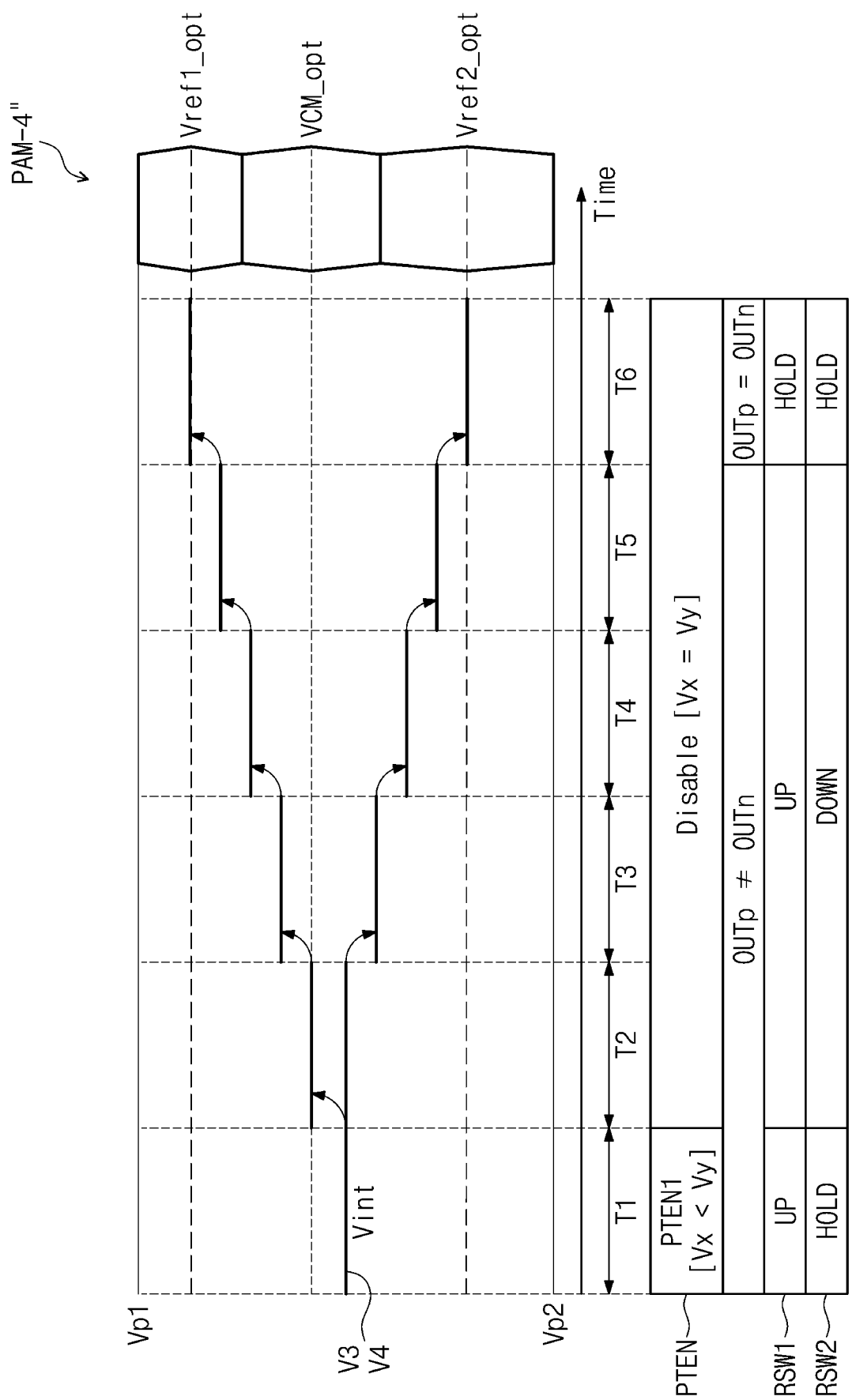

Referring to FIGS. 8, 9, and 11D, it is assumed that the received input signal DIN has a waveform of the 4-level pulse amplitude modulation PAM-4" as illustrated in FIG. 11D. Compared to the ideal 4-level pulse amplitude modulation PAM-4, the 4-level pulse amplitude modulation PAM-4" may have a data eye that is upward distorted (i.e., a data eye where all optimal reference voltages increase). Reference voltages that are optimized for the 4-level pulse amplitude modulation PAM-4" may be first and second optimal reference voltages Vref1_opt and Vref2_opt.

Unlike the embodiments of FIGS. 11A to 11C, in FIG. 11D, initial voltages of the voltages V3 and V4 of the third and fourth nodes, in response to the first pre-tuning signal PTEN1 during the first time T1, may be set to the same voltage such as an intermediate voltage Vcen. The intermediate voltage Vcen may be an intermediate value between the first and second peak voltages Vp1 and Vp2.

During the first time T1, the first intermediate voltage Vx may be lower than the second intermediate voltage Vy. In this case, the pre-turning control unit 123b may output the first pre-tuning signal PTEN1 corresponding to the first mode. Unlike the embodiment of FIG. 11B, in the embodiment of FIG. 11D, when the first intermediate voltage Vx is lower than the second intermediate voltage Vy and when the initial reference voltages for the voltages V3 and V4 of the third and fourth nodes are set to the intermediate voltage Vcen, the first pre-tuning signal PTEN1 is output instead of the second pre-tuning signal PTEN2. In the case of the embodiment of FIG. 11D, when the pre-turning control unit 123b outputs the second pre-tuning signal PTEN2 instead of the first pre-tuning signal PTEN1, the voltage V4 of the fourth node to be used as the second reference voltage Vref2_opt may stepwise increase, thereby making it impossible to track reference voltages.

The pre-turning control unit 123b may be configured to select the first mode or the second mode based on initial voltages of the voltage V3 of the third node and the voltage V4 of the fourth node and a result of comparing the first and second intermediate voltages Vx and Vy. For example, the pre-turning control unit 123b is configured to select one of the first mode and the second mode based on the initial voltages of the voltages V3 and V4 and a result of comparing the first and second intermediate voltages Vx and Vy.

During the second time T2, as the first reference switching signal RSS1 indicates "UP", the voltage V3 of the third node may increase by the given magnitude. The first condition (i.e., Vx=Vy) may be satisfied during the second time T2. As in the above description, during the third to sixth times T3 to T6, the voltage V3 of the third node may stepwise increase based on the first reference switching signal RS indicating "UP, and the voltage V4 of the fourth node may stepwise decrease based on the second reference switching signal RSS2 indicating "DOWN". During the sixth time T6, the second condition (i.e., OUTp=OUTn) may be satisfied.

In this case, the voltage V3 of the third node may be used as the first reference voltage Vref1_opt, and the voltage V4 of the fourth node may be used as the second reference voltage Vref2_opt.

As described with reference to FIGS. 11A to 11D, the reference voltage generator 120 or the reference voltage tracking circuit 123 may track or generate the optimal reference voltages Vref1_opt and Vref2_opt for the input signal DIN. Accordingly, even though distortion occurs in the input signal DIN due to various factors, the optimal reference voltages Vref1_opt and Vref2_opt may be dynamically tracked. Accordingly, reliability of a signal receiver may be improved.

Figure 12:
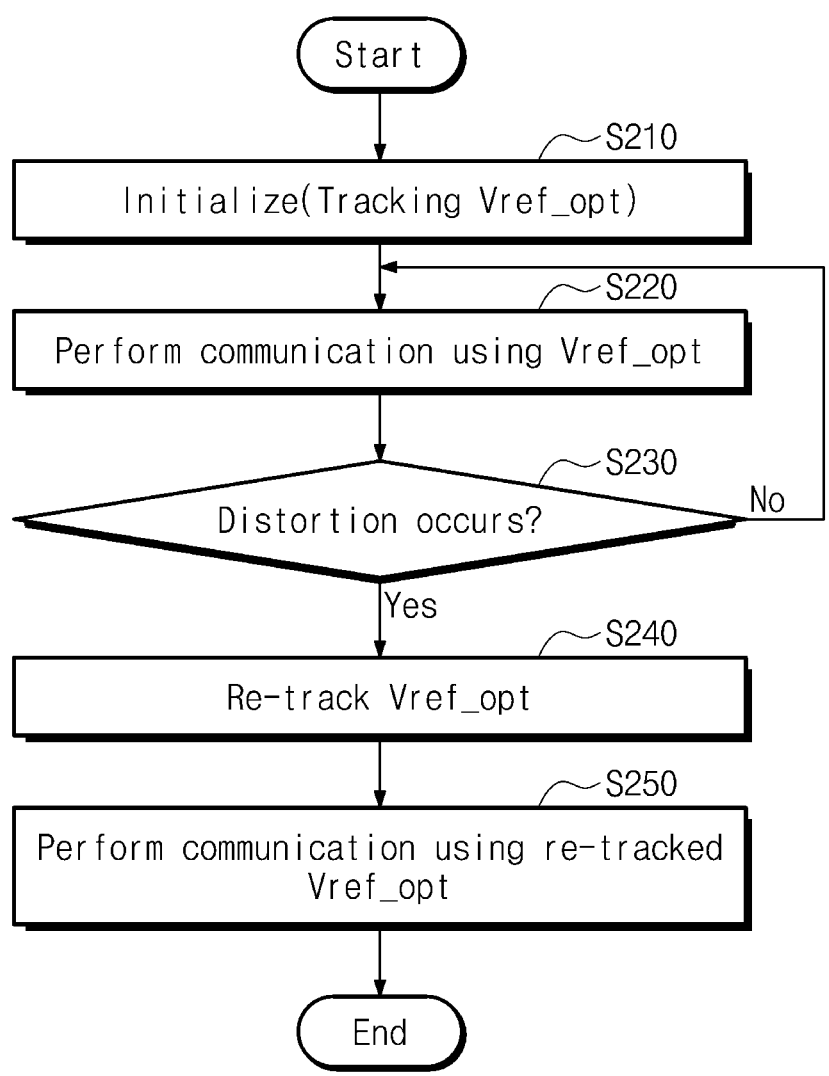
FIG. 12 is a flowchart illustrating an operation of a signal receiver of FIG. 3.

FIG. 12 is a flowchart illustrating an operation of a signal receiver of FIG. 3. For convenience of description, additional description associated with the components described above will be omitted to avoid redundancy. Referring to FIGS. 3 and 12, in operation S210, the signal receiver 100 may perform an initialization operation. For example, the signal receiver 100 may be included in the second communication device 12 of FIG. 1, and the first and second communication devices 11 and 12 may perform the initialization operation for improving the reliability of communication before a normal operation. In this case, the first communication device 11 may transmit an input signal DIN as a test signal to the second communication device 12. In an exemplary embodiment, the input signal DIN may have a given pattern or may have a random pattern. The second communication device 12 may perform the initialization operation based on the input signal DIN received through the channel CH. In an exemplary embodiment, the signal receiver 100 of the second communication device 12 may track or generate optimal reference voltages Vref_opt corresponding to the received input signal DIN based on the optimal reference voltage tracking/generating method described with reference to FIGS. 3 to 11D.

In operation S220, the signal receiver 100 may perform communication by using the optimal reference voltages Vref_opt generated in operation S210. For example, the signal receiver 100 may receive a second input signal from an external device (e.g., the first communication device 11 of FIG. 1) and may determine bit values corresponding to the second input signal by using the optimal reference voltages Vref_opt.

In operation S230, the signal receiver 100 may determine whether distortion occurs. For example, the case where a bit value determined by the signal receiver 100 is different from an originally intended bit value may be determined as the distortion occurs. In an exemplary embodiment, whether distortion occurs may be determined by a separate distortion detecting circuit. In an exemplary embodiment, whether distortion occurs may be detected by an external device (e.g., the first communication device 11 of FIG. 1) that transmits the input signal DIN to the signal receiver 100 of the second communication device of 12 of FIG. 1. When it is determined that the distortion does not occur, the signal receiver 100 continues to perform operation S220.

When it is determined that the distortion occurs, in operation S240, the signal receiver 100 may re-track the optimal reference voltages Vref_opt. For example, when the distortion occurs, the input signal DIN may not be accurately determined through the optimal reference voltages Vref_opt previously generated in operation S210. In this case, the signal receiver 100 may re-track optimal reference voltages based on the optimal reference voltage tracking/generating method described with reference to FIGS. 3 to 11D. In an exemplary embodiment, in the operation of tracking optimal reference voltages, initial voltages of the voltages V3 and V4 of the third and fourth nodes (refer to FIG. 8) may be optimal reference voltages previously generated (e.g., optimal reference voltages generated in operation S210). The remaining operations are similar to those described above except that initial reference voltages of the voltages V3 and V4 of the third and fourth nodes are previous optimal reference voltages, and thus, additional description will be omitted to avoid redundancy.

In operation S250, the signal receiver 100 may perform communication by using the optimal reference voltages thus re-tracked in operation S240. The communication of the signal receiver 100 or the operation of determining bit values of an input signal is similar to that described above except that optimal reference voltages are re-tracked, and thus, additional description will be omitted to avoid redundancy.

As described above, the signal receiver 100 according to an embodiment of the inventive concept may generate optimal reference voltages for the input signal DIN. In this case, even though the input signal DIN is distorted due to various factors, optimal reference voltages may be dynamically or actively tracked, and thus, the reliability of the signal receiver 100 may be improved.

Figure 13:
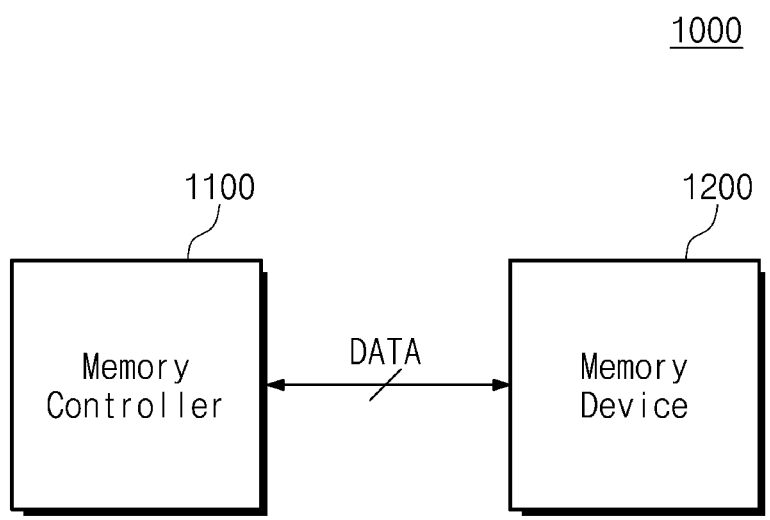
FIG. 13 is a block diagram illustrating a memory system according to an embodiment of the inventive concept.

FIG. 13 is a block diagram illustrating a memory system according to an embodiment of the inventive concept. Referring to FIG. 13, a memory system 1000 may include a memory controller 1100 and a memory device 1200. The memory controller 1100 may be configured to control the memory device 1200. For example, the memory controller 1100 may store data "DATA" in the memory device 1200 or may read the data "DATA" stored in the memory device 1200. The memory device 1200 may operate under control of the memory controller 1100. In an exemplary embodiment, the memory device 1200 may include a volatile memory device, in which stored data disappear when power is turned off, such as a static random access memory (SRAM) or a dynamic random access memory (DRAM), or a nonvolatile memory device, in which stored data are retained even when power is turned off, such as a flash memory device, a phase-change RAM (PRAM), a magnetic RAM (MRAM), a resistive RAM (RRAM), or a ferroelectric RAM (FRAM).

In an exemplary embodiment, the memory controller 1100 and the memory device 1200 may exchange the data "DATA" modulated based on the 4-level pulse amplitude modulation (PAM-4). In this case, each of the memory controller 1100 and the memory device 1200 may include the signal receiver 100 described with reference to FIGS. 3 to 12 or may be configured to track/generate optimal reference voltages based on the operation method described with reference to FIGS. 3 to 12.

In an exemplary embodiment, the memory controller 1100 and the memory device 1200 may exchange any other control signals (e.g., a command, an address, and a control signal) in addition to the data "DATA". In this case, as well as the data "DATA", the other control signals (e.g., a command, an address, and a control signal) may be modulated based on the 4-level pulse amplitude modulation (PAM-4). For the other control signals, each of the memory controller 1100 and the memory device 1200 may include the signal receiver 100 described with reference to FIGS. 3 to 12 or may be configured to track/generate optimal reference voltages based on the operation method described with reference to FIGS. 3 to 12.

In an exemplary embodiment, the optimal reference voltage tracking/generating operation according to an embodiment of the inventive concept may be performed in an initialization process, a training process, or a calibration process of the memory system 1000.

Figure 14:
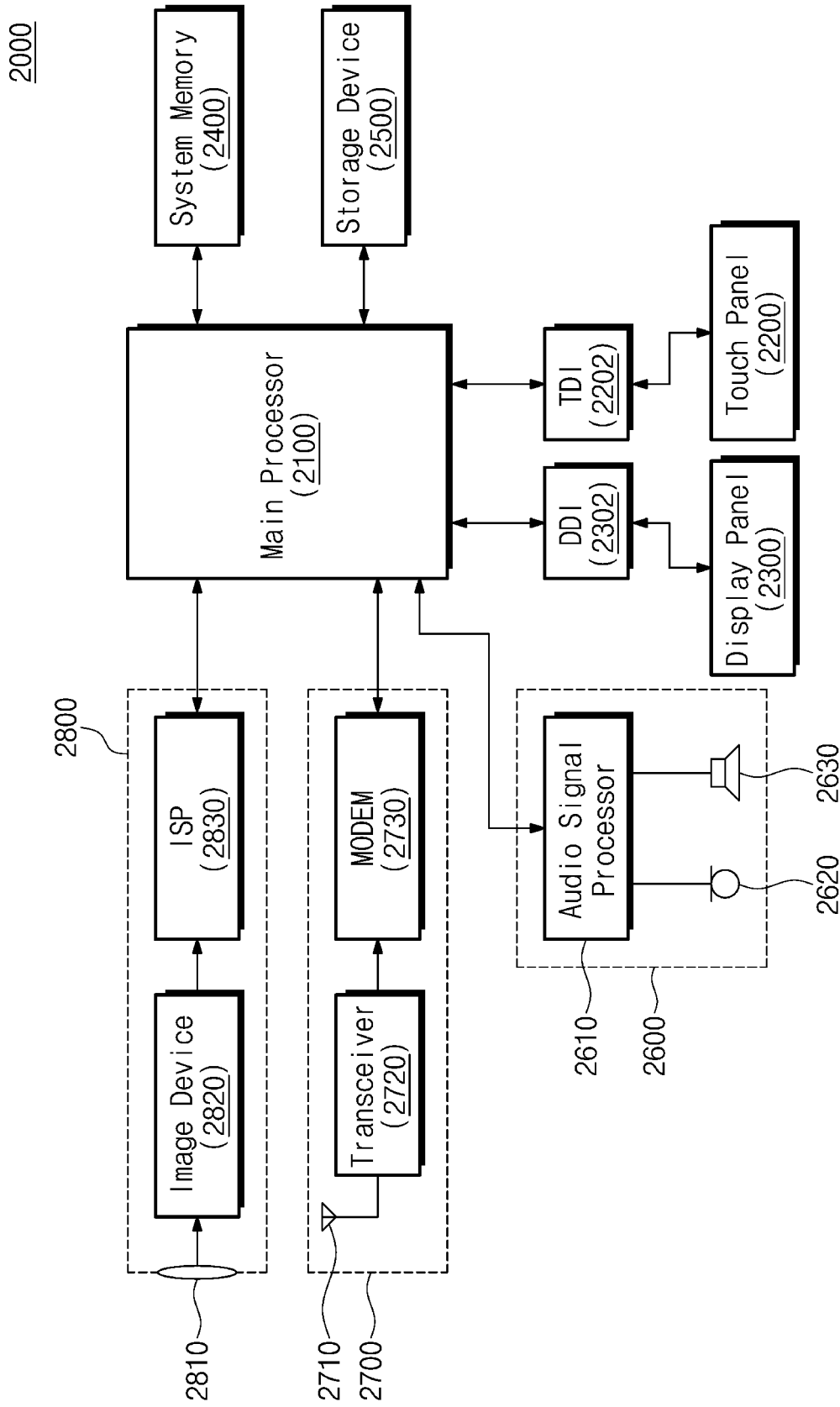
FIG. 14 is a block diagram illustrating an electronic device according to the inventive concept.

FIG. 14 is a block diagram illustrating an electronic device according to the inventive concept. Referring to FIG. 14, an electronic device 2000 may include a main processor 2100, a touch panel 2200, a touch driving integrated circuit 2202, a display panel 2300, a display driving integrated circuit 2302, a system memory 2400, a storage device 2500, an audio processor 2600, a communication block 2700, and an image processor 2800. In an exemplary embodiment, the electronic device 2000 may be one of various electronic devices such as a portable communication terminal, a personal digital assistant (PDA), a portable media player (PMP), a digital camera, a smartphone, a tablet computer, a laptop computer, and a wearable device.

The main processor 2100 may control overall operations of the electronic device 2000. The main processor 2100 may control/manage operations of the components of the electronic device 2000. The main processor 2100 may process various operations to operate the electronic device 2000.

The touch panel 2200 may be configured to sense a touch input from a user under control of the touch driving integrated circuit 2202. The display panel 2300 may be configured to display image information under control of the display driving integrated circuit 2302.

The system memory 2400 may store data that are used for an operation of the electronic device 2000. For example, the system memory 2400 may include a volatile memory such as a static random access memory (SRAM), a dynamic RAM (DRAM), or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM).

The storage device 2500 may store data regardless of whether power is supplied. For example, the storage device 2500 may include at least one of various nonvolatile memories such as a flash memory, a PRAM, an MRAM, a ReRAM, and a FRAM. For example, the storage device 2500 may include an embedded memory and/or a removable memory of the electronic device 2000.

The audio processor 2600 may process an audio signal by using an audio signal processor 2610. The audio processor 2600 may receive an audio input through a microphone 2620 or may provide an audio output through a speaker 2630.

The communication block 2700 may exchange signals with an external device/system through an antenna 2710. A transceiver 2720 and a modulator/demodulator (MODEM) 2730 of the communication block 2700 may process signals exchanged with the external device/system, based on at least one of various wireless communication protocols such as long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 2800 may receive light through a lens 2810. An image device 2820 and an image signal processor 2830 included in the image processor 2800 may generate image information about an external object, based on the received light.

In an exemplary embodiment, various components included in the electronic device 2000 of FIG. 14 or various function blocks included in each of the components may exchange information based on a 4-level pulse amplitude modulation (PAM-4) scheme through various communication paths or channels. In this case, the components included in the electronic device 2000 of FIG. 14 or the function blocks included in each of the components may include the signal receiver 100 described with reference to FIGS. 3 to 12 or may be configured to track/generate optimal reference voltages based on the operation method described with reference to FIGS. 3 to 12.

According to the inventive concept, a signal receiver may dynamically track or generate optimal reference voltages for a received input signal. Accordingly, the signal receiver with improved reliability and an operation method thereof are provided.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A signal receiver comprising:
a data sampler configured to receive a differential input signal having a first input signal and a second input signal being a complementary signal of the first input signal, and to determine bit values of the differential input signal based on a first reference voltage and a second reference voltage; and
a reference voltage generator configured to perform a pre-tuning operation and a post-tuning operation to generate the first reference voltage and the second reference voltage,
wherein the reference voltage generator is configured to perform the pre-tuning operation by generating a first initial voltage and a second initial voltage and adjusting one of the first initial voltage and the second initial voltage to generate a third voltage and a fourth voltage, based on the first input signal and the second input signal, and
wherein the reference voltage generator is further configured to, after performing the pre-tuning operation, perform the post-tuning operation by increasing or decreasing the third voltage to generate the first reference voltage and decreasing or increasing the fourth voltage to generate the second reference voltage based on a first comparison result between the third voltage and the first input signal and a second comparison result between the fourth voltage and second input signal.

2. The signal receiver of claim 1,
wherein the reference voltage generator includes:
a peak voltage tracking circuit configured to generate a first peak voltage indicating the highest voltage level of the differential input signal and a second peak voltage indicating the lowest voltage level of the differential input signal, based on the first and second input signals;
a common voltage tracking circuit configured to generate a common voltage being an average value of the first and second input signals; and
a reference voltage tracking circuit configured to:
perform the pre-tuning operation based on the first peak voltage, the second peak voltage, the common voltage, the third voltage and the fourth voltage; and
perform, in response to completion of the pre-tuning operation and a comparison result between the first comparison result and the second comparison result, the post-tuning operation to increase or decrease the third voltage by a first amount to generate the first reference voltage and decrease or increase the fourth voltage by the first amount to generate the second reference voltage.

3. The signal receiver of claim 2,
wherein the peak voltage tracking circuit is configured to output an enable signal after generating the first peak voltage and the second peak voltage, and
wherein the reference voltage tracking circuit is further configured to receive the first peak voltage, the second peak voltage and the enable signal, and start the pre-tuning operation in response to the enable signal.

4. The signal receiver of claim 2,
wherein the peak voltage tracking circuit includes:
a first comparator configured to compare a voltage of a first node and the first input signal to output a third comparison result;
a second comparator configured to compare a voltage of a second node and the second input signal to output a fourth comparison result;
a peak switch control circuit configured to output a first peak switching signal and a second peak switching signal based on the third comparison result and the fourth comparison result; and
a first voltage divider connected between a power supply voltage and a ground voltage, connected to the first comparator and the second comparator, respectively, through the first node and the second node, and configured to adjust one of the voltage of the first node and the voltage of the second node, based on the first peak switching signal and the second peak switching signal,
wherein the voltage of the first node and the voltage of the second node, which are outputs of the first voltage divider, correspond the first peak voltage and the second peak voltage, respectively.

5. The signal receiver of claim 2,
wherein the common voltage tracking circuit includes:
a first unity gain buffer;
a first resistor connected to an input terminal of the first unity gain buffer and configured to receive the first input signal; and
a second resistor connected to the input terminal of the first unity gain buffer and configured to receive the second input signal,
wherein the first resistor and the second resistor are connected in parallel to the input terminal of the first unity gain buffer, and
wherein a resistance value of the first resistor is equal to a resistance value of the second resistor.

6. The signal receiver of claim 2,
wherein the reference voltage tracking circuit includes:
a second voltage divider connected between the first peak voltage and the second peak voltage;
a pre-tuning control circuit configured to output a pre-tuning signal based on the first peak voltage, the second peak voltage, the common voltage, a voltage of a third node, and a voltage of a fourth node, wherein the pre-tuning control circuit is connected to the second voltage divider through the third node and the fourth node;
a third comparator connected to the second voltage divider through the third node and configured to compare the voltage of the third node and the first input signal to output a third comparison result;
a fourth comparator connected to the second voltage divider through the fourth node and configured to compare the voltage of the fourth node and the second input signal to output a fourth comparison result; and a reference switch control circuit configured to output a first reference switching signal and a second reference switching signal to the second voltage divider based on the pre-tuning signal, the third comparison result, and the fourth comparison result, wherein the second voltage divider is configured to, in response to the first reference switching signal and the second reference switching signal, control the voltage of the third node and the voltage of the fourth node.

7. The signal receiver of claim 6,
wherein the pre-tuning control circuit includes:
a second unity gain buffer;
a third resistor connected between the third node and an input terminal of the second unity gain buffer;
a fourth resistor connected between the fourth node and the input terminal of the second unity gain buffer;
a third unity gain buffer;
a fifth resistor connected to an input terminal of the third unity gain buffer which is configured to receive the first peak voltage;
a sixth resistor connected to the input terminal of the third unity gain buffer which is configured to receive the second peak voltage;
a seventh resistor connected to the input terminal of the third unity gain buffer which is configured to the common voltage,
wherein the fifth resistor, the sixth resistor and the seventh resistor are connected in parallel to the input terminal of the third unity gain buffer; and
a fifth comparator configured to compare an output of the second unity gain buffer and an output of the third unity gain buffer and to output the pre-tuning signal as a result of the comparison.

8. The signal receiver of claim 7,
wherein the reference voltage generator, in response to the output of the second unity gain buffer and the output of the third unity gain buffer being different from each other, performs the pre-tuning operation,
wherein the reference switch control circuit, is configured to, in response to a first mode of the pre-tuning signal being outputted from the pre-tuning control circuit, generate the first reference switching signal such that the voltage of the third node decreases, the first mode of the pre-tuning signal corresponding to when the output of the second unity gain buffer is greater than the output of the third unity gain buffer, and
wherein the reference switch control circuit is configured to, in response to a second mode of the pre-tuning signal, generate the second reference switching signal such that the voltage of the fourth node increases, the second mode of the pre-tuning signal corresponding to when the output of the second unity gain buffer is smaller than the output of the third unity gain buffer.

9. The signal receiver of claim 8,
wherein the pre-tuning control circuit is configured to, in response to the output of the second unity gain buffer and the output of the third unity gain buffer being the same as each other, generate a disabled pre-tuning signal,
wherein the reference voltage generator is configured to, in response to the disabled pre-tuning signal outputted from the pre-tuning control circuit, perform the post-tuning operation such that the reference switch control circuit generates the first reference switching signal to decrease the voltage of the third node and generates the second reference switching signal to increase the voltage of the fourth node.

10. The signal receiver of claim 9,
wherein the reference voltage generator is configured to repeat the post-tuning operation is until the third comparison result of the third comparator is the same as the fourth comparison result of the fourth comparator.

11. The signal receiver of claim 1,
wherein the differential input signal is an N-level PAM (PAM-N) multilevel signal, N being greater than four inclusive.

12. The signal receiver of claim 11,
wherein the data sampler is configured to:
determine the bit values of the differential input signal as a first value when the first input signal is higher than the first reference voltage;
determine the bit values of the differential input signal as a second value when the first input signal is lower than the second reference voltage;
determine the bit values of the differential input signal as a third value when the first input signal is lower than the first reference voltage and is higher than the second reference voltage and the first input signal is higher than the second input signal; and
determine the bit values of the differential input signal as a fourth value when the first input signal is lower than the first reference voltage and is higher than the second reference voltage and the first input signal is lower than the second input signal.

13. An operation method of a signal receiver, the method comprising:
receiving a differential input signal having a first input signal and a second input signal being a complementary signal of the first input signal;
performing a pre-tuning operation, the pre-tuning operation including:
generating a first peak voltage, a second peak voltage, and a common voltage based on the first input signal and the second input signal, wherein the first peak voltage is greater than the second peak voltage, and wherein the common voltage is between the first peak voltage and the second peak voltage;
setting a first initial voltage and a second initial voltage, wherein the first initial voltage and the second initial voltage are between the first peak voltage and the second peak voltage; and
increasing or decreasing one of the first initial voltage and the second initial voltage to generate a first voltage and a second voltage until the first voltage and the second voltage satisfy a first condition;
performing, after the performing of the pre-tuning operation, a post-tuning operation to generate a first optimal reference voltage and a second optimal reference voltage,
the post-tuning operation including increasing or decreasing the first voltage stepwise and decreasing or increasing the second voltage stepwise to generate a first optimal reference voltage and a second optimal reference voltage until the first optimal reference voltage and the second optimal reference voltage satisfy a second condition, wherein the first voltage increased or decreased and the second voltage decreased or increased, during a time when the post-tuning operation is performed, satisfy the first condition; and
determining bit values of the differential input signal based on the first optimal reference voltage and the second optimal reference voltage.

14. The method of claim 13,
wherein the first condition indicates a condition at which a sum of the first voltage and the second voltage is the same as a sum of the common voltage and an intermediate value between the first peak voltage and the second peak voltage, and
wherein the second condition indicates a condition at which a comparison result between the first optimal reference voltage and the first input signal is the same as a comparison result between the second optimal reference voltage and the second input signal.

15. The method of claim 13,
wherein an increment or a decrement by which the first voltage stepwise increases or decreases is equal to a decrement or an increment by which the second voltage stepwise decreases or increases.

16. The method of claim 13,
wherein the first initial voltage is ⅔ times a sum of the first peak voltage and the second peak voltage and the second initial voltage is ⅓ times the sum of the first peak voltage and the second peak voltage,
wherein, when a sum of the first voltage and the second voltage is greater than a sum of the common voltage and an intermediate value between the first peak voltage and the second peak voltage, the first voltage is generated by decreasing the first initial voltage, and the second voltage is generated by maintaining the second initial voltage, and
wherein, when the sum of the first voltage and the second voltage is smaller than the sum of the common voltage and the intermediate value between the first peak voltage and the second peak voltage, the first voltage is generated by maintaining the first initial voltage, and the second voltage is generated by increasing the second initial voltage.

17. The method of claim 13,
wherein each of the first initial voltage and the second initial voltage has the same voltage of an intermediate value between the first peak voltage and the second peak voltage,
wherein, when a sum of the first voltage and the second voltage is greater than a sum of the common voltage and the intermediate value between the first peak voltage and the second peak voltage, the first voltage is generated by maintaining the first initial voltage, and the second voltage is generated by decreasing the second initial voltage, and
wherein, when the sum of the first voltage and the second voltage is smaller than the sum of the common voltage and the intermediate value between the first peak voltage and the second peak voltage, the first voltage is generated by increasing the first initial voltage, and the second voltage is generated by maintaining the second initial voltage.

18. The method of claim 13,
wherein the differential input signal is an N-level PAM (PAM-N) multilevel signal, N being greater than four inclusive.

19. An operation method of a signal receiver, the method comprising:
performing an initialization operation to generate a first reference voltage and a second reference voltage;
receiving a differential input signal having a first input signal and a second input signal being a complementary signal of the first input signal from an external device;
determining first bit values of the differential input signal based on the first and second reference voltages, wherein the differential input signal is an N-level PAM (PAM-N) multilevel signal, N being greater than four inclusive;
detecting whether distortion occurs on the differential input signal based on the determined first bit values of the differential input signal;
performing, in response to detecting of the distortion, a pre-tuning operation by adjusting one of the first reference voltage and the second reference voltage to generate a first voltage and a second voltage based on the first input signal and the second input signal;
performing a post-tuning operation by increasing or decreasing the first voltage to generate a first optimal reference voltage and decreasing or increasing the second voltage to generate a second optimal reference voltage based on a first comparison result between the first voltage and the first input signal and a second comparison result between the second voltage and the second input signal; and
determining bit values of the differential input signal based on the first optimal reference voltage and the second optimal reference voltage.

20. The method of claim 19,
wherein the increasing or decreasing of the one of the first reference voltage and the second reference voltage is performed until the first voltage and the second voltage satisfy a first condition,
wherein the increasing or decreasing of the first voltage and the decreasing or increasing of the second voltage is performed until the first optimal reference voltage and the second optimal reference voltage satisfy a second condition,
wherein the first voltage increased or decreased, and the second voltage decreased or increased, during a time when the post-tuning operation is performed, satisfy the first condition,
wherein the first condition indicates a condition at which a sum of the first voltage and the second voltage is the same as a sum of a common voltage and an intermediate value between a first peak voltage and a second peak voltage,
wherein the second condition indicates a condition at which a comparison result between the first optimal reference voltage and the first input signal is the same as a comparison result between the second optimal reference voltage and the second input signal, and
wherein the first peak voltage indicates the highest voltage level of the differential input signal, the second peak voltage indicates the lowest voltage level of the differential input signal, and the common voltage indicates an average value of the first input signal and the second input signal.

* * * * *